US011663377B2

(12) United States Patent
DeVore et al.

(10) Patent No.: US 11,663,377 B2
(45) Date of Patent: May 30, 2023

(54) SENSOR ARRANGEMENT VALIDATION USING SIMULATED ENVIRONMENTS

(71) Applicant: Woven Planet North America, Inc., Los Altos, CA (US)

(72) Inventors: David Bearl DeVore, Daly City, CA (US); Alexander Charles Granieri, Palo Alto, CA (US); Alfred Charles Jones, II, San Jose, CA (US); Han Han Xue, San Francisco, CA (US)

(73) Assignee: Woven Planet North America, Inc., Los Altos, CA (US)

( * ) Notice: Subject to any disclaimer, the term of this patent is extended or adjusted under 35 U.S.C. 154(b) by 624 days.

(21) Appl. No.: 16/586,496

(22) Filed: Sep. 27, 2019

(65) Prior Publication Data
US 2021/0097147 A1 Apr. 1, 2021

(51) Int. Cl.
*G06F 30/20* (2020.01)
*G06T 17/05* (2011.01)
*G01S 17/89* (2020.01)
*G06F 30/15* (2020.01)
*G06V 20/56* (2022.01)

(52) U.S. Cl.
CPC ............. *G06F 30/20* (2020.01); *G01S 17/89* (2013.01); *G06F 30/15* (2020.01); *G06T 17/05* (2013.01); *G06V 20/56* (2022.01)

(58) Field of Classification Search
CPC .......... G06F 30/20; G06F 30/15; G06F 30/25; G06F 30/27; G06F 30/28; G06F 2111/00; G01S 17/89; G01S 17/931; G01S 7/4813; G01S 7/497; G06T 17/05; G06V 20/56; G06V 20/58; G06V 20/582; G06V 20/584; G06V 20/586; G06V 20/588; G06K 9/6201
See application file for complete search history.

(56) References Cited

U.S. PATENT DOCUMENTS

2018/0203445 A1* 7/2018 Micks ..................... G06F 30/20
2019/0179979 A1* 6/2019 Melick .................... G06F 30/20
2020/0218910 A1* 7/2020 Herman ................. G06V 20/20

* cited by examiner

*Primary Examiner* — Rehana Perveen
*Assistant Examiner* — Troy A Maust
(74) *Attorney, Agent, or Firm* — Christopher G. Darrow; Darrow Mustafa PC

(57) ABSTRACT

In one embodiment, a method includes generating a simulated sensor based on performance features associated with a sensor. The method includes determining a placement indicator specifying a location and orientation of the simulated sensor on a vehicle in a virtual environment associated with the vehicle. The method includes simulating, based on the performance features associated with the sensor, behavior of one or more emissions originating from the simulated sensor in the virtual environment. For each emission, the simulating includes determining an interaction of the emission with one or more simulated objects in the virtual environment. The method includes providing a representation of a capability of the sensor based on the simulated behavior of the emissions.

19 Claims, 13 Drawing Sheets

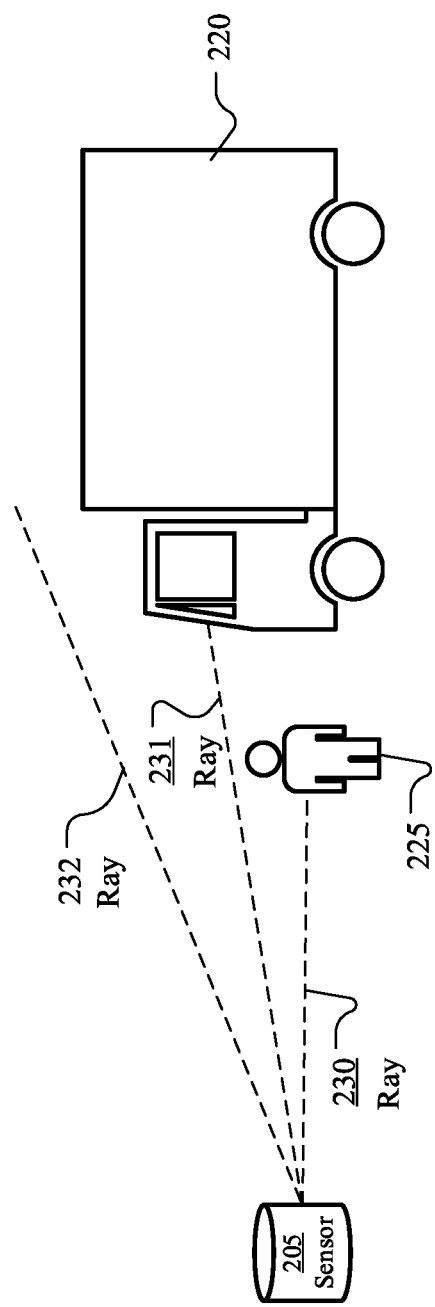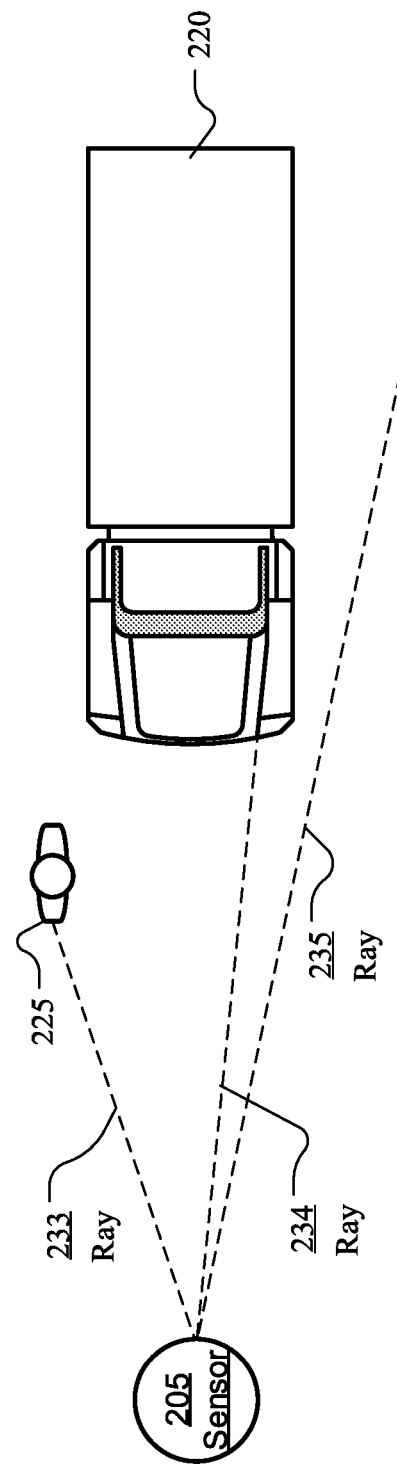

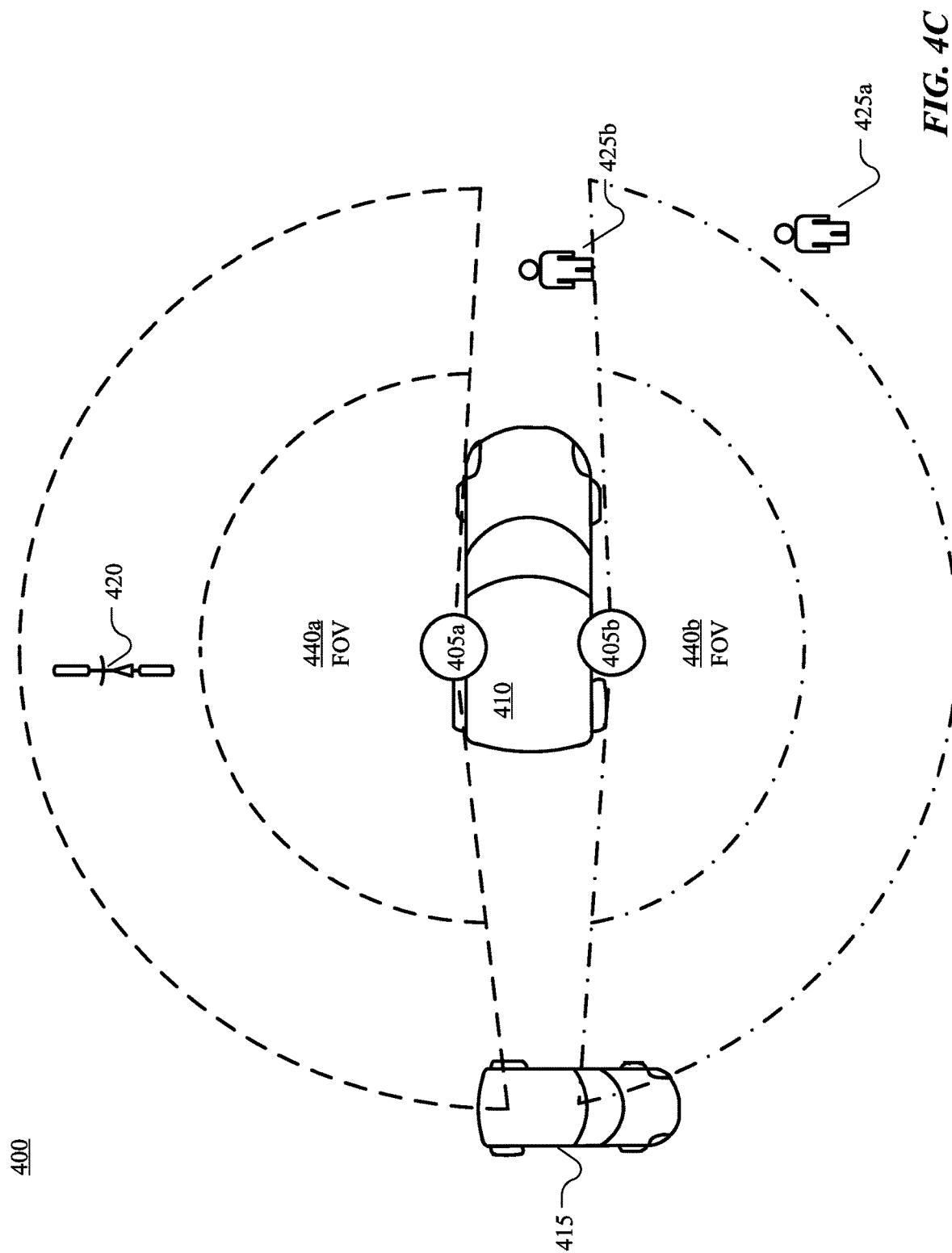

600a
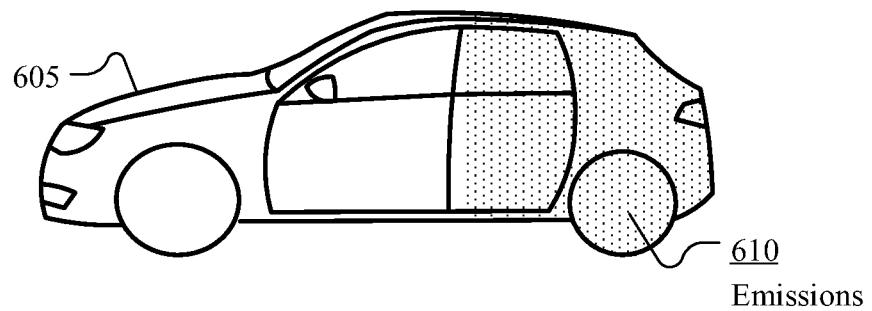
610
Emissions
600b
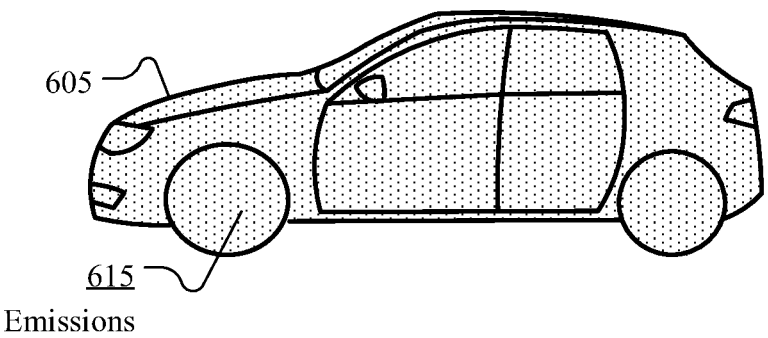
615
Emissions
*FIG. 6*

SENSOR ARRANGEMENT VALIDATION USING SIMULATED ENVIRONMENTS

BACKGROUND

Modern vehicles, and particularly vehicles used for day-to-day transportation, are equipped with a variety of sensors. These sensors may be used to assist a vehicle operator with operation of the vehicle. The sensors may be used to allow a computing system to temporarily assume control of a vehicle at the request of the vehicle operator. Sensors may also be used to facilitate operation of most or all functions of a vehicle without additional human input. To ensure that a sensor can perform its function appropriately when coupled with a particular vehicle, rigorous design, prototyping, and testing is often performed. One purpose of the rigorous testing process is to ensure that a sensor functions as expected. A camera sensor may be tested to ensure that it has visibility of the entire area specified. A lidar sensor may be tested to determine whether it is able to detect objects within an expected field of view and to an expected degree of accuracy.

However, designing, prototyping, and testing sensors and arrangements of sensors on vehicles is an expensive, time-consuming, and potentially hazardous task. Existing modeling tools may help designers visualize the mechanical configuration of sensors but provide no guidance on how well the configuration will perform. Instead, an adequate number of sensors must be acquired. Mounting apparatuses must be developed that are customized for the sensor and the vehicle. A testing environment must be devised that allows the tester to determine whether or not the design is successful. The mounting equipment must be durable enough to withstand the demands of a test vehicle in a testing environment. Furthermore, because of uncertainties in sensors capabilities, a testing vehicle must be tested in a carefully controlled environment until the design is validated. These factors contribute to a slow iteration of design approaches and methodologies, inhibiting innovation in the field of sensor and sensor arrangement design for vehicles.

BRIEF DESCRIPTION OF THE DRAWINGS

FIGS. 2A-2B illustrate an example for modeling capabilities of a sensor.

FIGS. 4A-4C illustrate an environment for determining performance characteristics of a sensor.

FIG. 6 illustrates examples of detected objects.

DESCRIPTION OF EXAMPLE EMBODIMENTS

Figure 1:
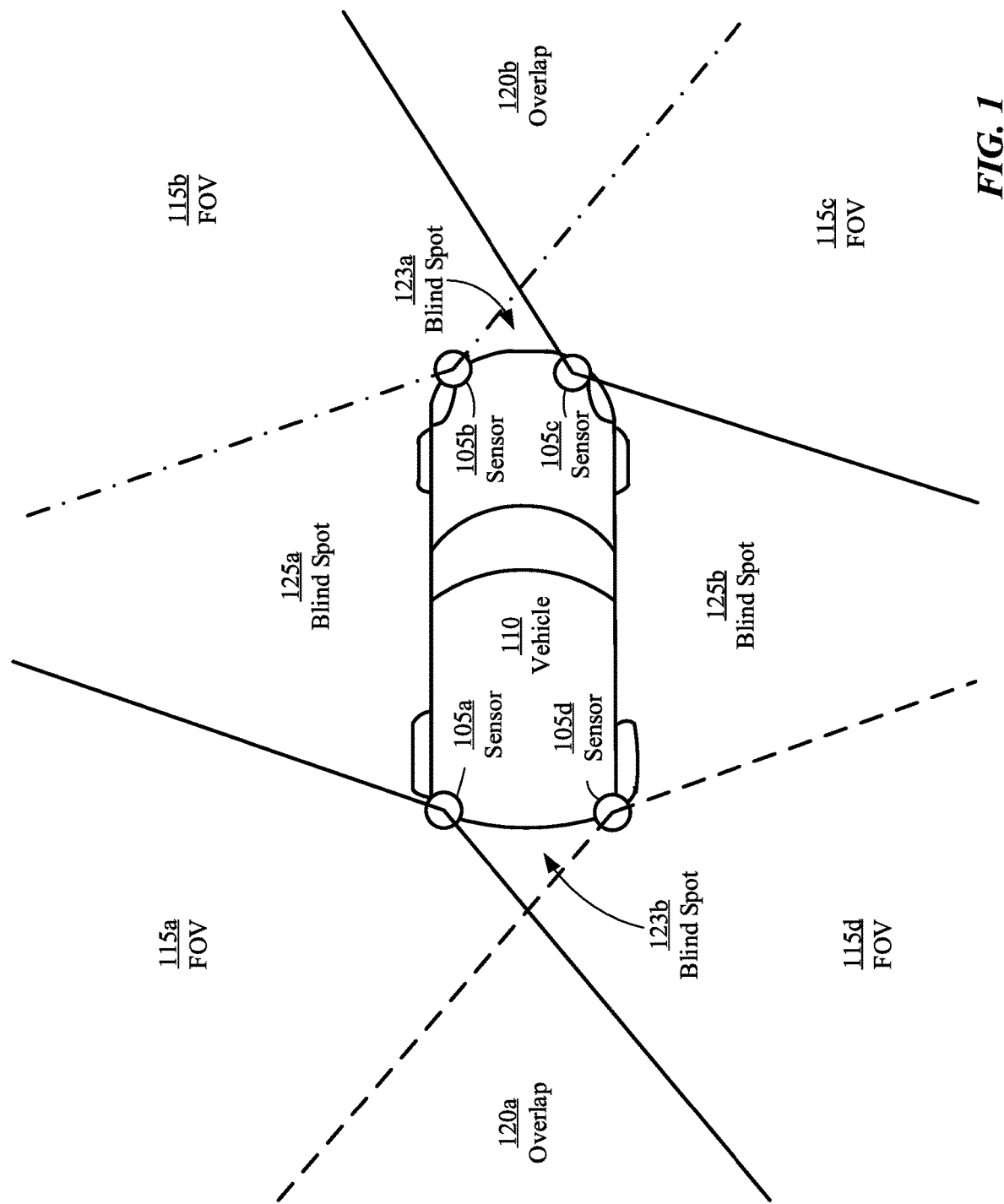
FIG. 1 illustrates example fields of view of sensors of a vehicle.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described. In addition, the embodiments disclosed herein are only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g., method, can be claimed in another claim category, e.g., system, as well. The dependencies or references back in the attached claims are chosen for formal reasons only. However, any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

Modern vehicles, and particularly vehicles used for day-to-day transportation are equipped with a variety of sensors. These sensors may be used to assist a vehicle operator with operation of the vehicle as in the case of a back-up or side-view camera. The sensors may be used to temporarily assume control of a vehicle at the request of the vehicle operator as in the case of lane following assistance or semi-autonomous vehicles. Sensors may also be used to facilitate operation of most or all functions of a vehicle without additional human input as in autonomous vehicles. To ensure that a sensor can perform its function appropriately when coupled with a particular vehicle, rigorous design, prototyping, and testing is typically performed. One purpose of this design and testing is to ensure that a sensor is able to detect its target within an expected field of view, to an expected degree of accuracy. For example, a camera sensor may be tested to ensure that it has visibility of the entire area needed by the vehicle. Existing modeling tools may help designers visualize the mechanical configuration of sensors but provide not guidance on how well the configuration will perform. Although the term field of view is often used to refer to the area through which a sensor can detect light (or other forms of electromagnetic radiation), throughout this disclosure, the term will also be used to encompass the range of detection capabilities of any type of sensor suitable for coupling with a vehicle.

FIG. 1 illustrates the fields of view of several vehicle-mounted sensors. FIG. 1 shows a vehicle 110 with four vehicle-mounted sensors 105a-105d. In some embodiments, the vehicle-mounted sensors may be light-based sensors (e.g., lidar sensors). In some embodiments, the vehicle-mounted sensors may include other types of sensors (e.g., directional audio-based sensors, optical sensors, etc.). The vehicle-mounted sensors 105a-105d illustrated in FIG. 1 are coupled to the vehicle 110 (e.g., to a sensor platform of the vehicle) at or near the headlights (in the case of sensors 105*b* and 105*c*) and the taillights (in the case of 105*a* and 105*d*). Therefore, the sensors 105*a*-105*d* are incapable of detecting objects behind their mounting points. Additionally, the sensors 105*a*-105*d* may be occluded at certain points in their range by components of the body of the vehicle 110. Each sensor has an associated field of view that covers a region of the environment of the vehicle 110. For example, field of view 115*a* corresponds to the region of the environment visible to sensor 105*a*, field of view 115*b* corresponds to sensor 105*b*, field of view 115*c* corresponds to sensor 105*c*, and field of view 115*d* corresponds to sensor 105*d*. As shown in FIG. 1, there are several areas of overlap between the fields of view. For example, fields of view 115*a* and 115*d* overlap at the overlap region 120*a*. Fields of view 115*b* and 115*c* overlap at the overlap region 120*b*. In particular arrangements, these overlaps may lead to inefficiencies, as more than one sensor may not be needed to track objects in that area. Another point is of even greater concern—blind spots. As shown, with this arrangement of sensors 105*a*-105*d*, there are several positions near the vehicle 110 at which no sensor would be able to detect an object. For example, directly in front and behind of the vehicle 110 there are small blind spots 123*a* and 123*b*, respectively, caused by occlusion by the vehicle body. As another example there are large areas off the sides of the vehicle that are not covered by any of sensors 105*a*-105*d*. These include blind spots 125*a* and 125*b*. Thus, this arrangement of sensors has several blind spots, despite the use of four evenly-spaced sensors.

Currently, the methods employed for designing, prototyping, and testing sensors and sensor arrangements based on performance characteristics are time consuming, expensive, and prone to error. Conventional tools fail to provide methods to allow the actual performance of a sensor to be visualized. Prototyping and testing the sensors may be used to determine the location of overlaps and blind spots in the sensors. The standard approach involves designing sensor performance specifications by hand, acquiring the sensors, mounting it to the vehicle or a stand-in for the vehicle, and subjecting the mounted sensor to a battery of tests in controlled environments. However, this procedure has many flaws. As a first example, it relies on a designer or engineer to foresee all potential use cases and use scenarios for a vehicle and accurately specify the requirements of a sensor or sensor arrangement to handle the scenarios. In the case of autonomous vehicles, or autonomously operating vehicles, one goal in designing the vehicles is to enable the vehicle to handle situations that it may not have been explicitly trained to handle (e.g., scenarios that it hasn't "seen" before). As a second example, it may be expensive and time-consuming to acquire new sensors. Additionally, certain sensor manufacturers may be hesitant to share their sensors with certain designers before the sensor is released to the market. Even acquiring one sensor will be insufficient, as often sensors are used in specific arrangements on a vehicle. When that sensor arrives, its capabilities must be confirmed through specialized benchmarking.

As a third example, it is difficult and expensive to reliably mount the sensors to a vehicle in a manner that appropriately approximates the way that a sensor would be used on a finished, production-ready vehicle. Absent mounting sensors to a vehicle and performing testing, it is difficult to reliably predict whether and where there are flaws in the design of a sensor arrangement. For example, it may not be possible to determine that, in a current arrangement, the field of view of a pair of cameras encompasses a specified area around the vehicle. However, mounts are often custom-made. Using cheaper prototyping materials (e.g., through 3D printing) creates risks that the results of testing will not be replicable using more permanent materials. Modular approaches to mounting sensors to vehicles are bulky and imprecise. As a fourth example, it may be dangerous to deploy relatively untested sensors in real-world testing environments. For this reason, many sensors are first tested in carefully controlled settings, again decreasing the value of the testing results. Even then, the sensors may only be physically tested in environments available to the design and engineering teams working on the sensor and sensor arrangement. Testing performed in an area with desert-like conditions may produce different results than testing performed in more varied conditions. These factors combine to create an inefficient iteration process, where considerable resources must be committed to even determine if a sensor is worth the effort of more rigorous and finely-tuned sensors. At present, there are limited solutions to improve on this prototyping process. Although this description and the description below relates particularly to sensors used with transportation vehicles, sensors used with vehicles of all types may benefit from the techniques described herein.

Several solutions to the problems of vehicle sensor arrangement choice and design described above are proposed. Simulations or digital models of vehicle sensors may be created using predetermined performance features or characteristics of the sensors. The features may be provided by specifications of sensor characteristics commonly provided by manufacturers. For example, in marketing a lidar sensor, a manufacturer may specify features such as accuracy, range, rate of revolution, laser wave length, beam divergence, optical aperture, ambient brightness, field of view, scanning frequency, power consumption, and many others. As another example, in marketing a camera, a manufacturer may specify features, such as range, aperture, resolution, sensor size, shutter speed, frame rate, ISO range, zoom, field of view, color, power consumption, and many others. As another example, in marketing a radar sensor, a manufacturer may specify wavelength, transmit power, band, transmit frequencies, pulse duration, detectable signal range, gain, beam width, polarization, scan speed, power consumption, and many others. This information may be codified using a computer model that will allow a simulator to estimate the performance characteristics of the lidar in an environment. Simulated sensors may be placed in virtual environments having a known arrangement of objects. Using standardized environments, a simulated sensor may be used to benchmark the performance of a sensor being considered as a candidate for inclusion in a sensor arrangement (e.g., for use in a vehicle). Moreover, multiple sensors may easily be added, moved, and tested. Quantifiable performance metrics may be developed, including metrics such as accuracy, distance, or beam efficiency (e.g., for a lidar sensor), field of view, error rate.

To improve the quality of a simulation, the sensors may be modeled using an approach related to raytracing. In such an approach the behavior of light, sound, or other detecting mediums, may be accurately simulated. For example, the number of projectiles (e.g., rays/emissions) used to simulate the detection media in a given space may vary based on specifications associated with the sensors as well as the actual expected behavior of the detection media (e.g., more projectiles may be used to simulate a light-based sensor than a sound-based sensor). The accurate simulation of detection media also allows for the simulation of effects caused by the particular arrangement of sensors on a vehicle, such as the when a portion of a vehicle (e.g., a mirror or body work) occults an object in or area of the environment. Accurate simulation of sensors and virtual environments significantly improves prototyping speed and efficiency by eliminating the time needed to physically examine a sensor, prepare the sensor for use on a vehicle, design and manufacture a mount for the sensor, and reconfigure a real-world environment for tests. In fact, varied or randomized environments may be developed to accurately determine a sensor's ability to record information about an environment.

The capabilities required of vehicle sensors to perform complex tasks may also be determined through rigorous simulations. In previous techniques, the performance requirements of a sensor, or arrangement of sensors, to detect the environment would be loosely specified or based on the idea that more is always better. Sensors are capable of detection along a wide range of variables such as range, field of view, accuracy, object density, cluster recognition, and others. These performance characteristics are also related to the cost of the sensor. Therefore, it would be beneficial to determine the minimum performance specifications that a vehicle operating system (such as an autonomous driving component) requires from a sensor or sensor arrangement to complete tasks. One method to determine minimum viable specifications would be to allow a vehicle to encounter the scenario while being given progressively less information. Once the vehicle reaches a failure state, then the minimum specifications can being determined. This approach has many clear downsides, including at least safety concerns, cost, and time. This disclosure contemplates repurposing the above described simulation techniques to simulate scenarios that conceivably may be experienced by the vehicle during operation. By generating varied virtual driving simulations, the true performance requirements of a sensor or sensor arrangement can be determined. The results of the simulation would therefore be ripe for use as design goals when choosing new sensors or designing new sensor arrangements. Virtual driving scenario simulation may allow for evaluation of driving scenarios that may occur with such low probability that they may not be captured during real-world testing or may be too risky or costly to justify purposely exposing a testing vehicle.

Once the prescribed capabilities of a sensor arrangements is determined, and a sensor arrangement is designed using simulation software, a remaining challenge lies in translating the virtual specification to a physical manifestation. As described herein, sensors may require customized mounting components for each type of vehicle or vehicle body location on which they are used. Additionally, care must be taken to design and manufacture mounts that are durable enough for physical validation testing. To facilitate physical testing, a test vehicle may be modified to streamline the process of mounting a new sensor or sensor arrangement to the vehicle. In particular embodiments, a test vehicle may be modified so that the body of the vehicle, and especially likely mounting locations such as the roof or near the wheel wells, may readily accept attachment of the sensors. It may be particularly advantageous that the modifications are made in a matter that allows the sensors to sit as close to the actual body panels of the vehicle as possible. This will allow for a low amount of deviation between the location of a sensor for testing purposes and a location of a sensor in a finished vehicle. One example mounting design may be to attach a pegboard-like apparatus having precise, discrete, predetermined mounting points to the body of the vehicle (e.g., to the roof, door panels, etc.). The pegboard apparatus, with regularly spaced holes to accept mounting equipment, may allow for sensors to be quickly and easily mounted to the vehicle. Furthermore, the regular pattern can be incorporated into digital models of vehicles used when assessing sensor and sensor arrangement performance. This will greatly enhance the accuracy of translating a digital design to a physical vehicle.

Previously, the only reliable method to detect these blind spots and overlaps was to estimate their occurrence based on known or expected characteristics of the sensors and approximated positions of sensors relative to a vehicle. For example, it would be straightforward to determine that a sensor could not detect objects when blocked by the portion of the vehicle to which it is mounted. The same cannot necessarily be said for whether a sensor will be able to see around a side mirror or a wheel well. To detect the exact limits of the fields of view of a sensor, it must be mounted to a vehicle and rigorously tested in carefully controlled environments. This procedure is expensive and time-consuming. An adequate number of sensors must be acquired. Custom-made brackets may be required to mount the sensors to a vehicle. While some techniques, such as 3D printing, may help control fabrication costs, they often come at the sacrifice of quality and durability. A 3D-printed bracket may be usable on a stationary vehicle but will likely be unsuitable for a vehicle in motion. Furthermore, the temporary brackets used for testing the sensor arrangement are often bulky and do not resemble the types of designs that would be preferred for final production-quality arrangements. Thus, the initial testing done with brackets may not exactly replicate the results of a finished vehicle. The testing results may be helpful in an initial determination, but the actual results of a production-quality vehicle may be substantially different.

A first approach to improving the process of sensor selection makes use of accurate simulation of sensors in a virtual environment. In particular embodiments, the sensor simulation may be based in predetermined performance features or characteristics of the sensor. Many sensor manufacturers release detailed performance specifications for their sensors. For example, in marketing a lidar sensor, a manufacturer may advertise features such as accuracy, range, rate of revolution, laser wave length, beam divergence, optical aperture, ambient brightness, field of view, scanning frequency, and many others. The performance specifications may be used to model the sensor as a simulated sensor for use in simulated virtual environments. With a simulated sensor, a sensor being evaluated for a vehicle or being evaluated in a particular sensor arrangement, may be easily manipulated in the virtual environment. Thus, many different sensors, variations, and sensor arrangements can be tested in a fraction of the time it would take using previous techniques.

In particular embodiments, sensors may be modeled using techniques derived from raytracing. In one approach to raytracing, light is modeled in a digital environment as a ray emitting from a light source. A camera in the digital environment detects a light ray when the ray intersects with the camera. Based on the reflection of the ray in the environment, the camera determines a color of the light which may be used to color pixels of a screen. In another approach, each pixel of a screen is assigned a ray that emits from the camera into the environment. The light rays may reflect off various surfaces in the environment, collecting color contributions from the surfaces, before a color for the light ray is used to color the pixel.

In particular embodiments, before modeling a sensor, the type of the sensor may be determined. A wide variety of possible sensors may be models, including, but not limited to, lidar sensors, radar sensors, radio frequency (RF) sensors, optical sensors, cameras, sonic sensors, ultrasonic sensors, magnetometers, positioning system sensors, and other similar sensors. For example, to model the behavior of a lidar sensor in a simulated environment, light emitted by the sensor may be simulated as a ray or a particle emitted into the scene originating at the sensor. For a radar sensor, the radio waves emitted by the sensor may be simulated as emissions from the sensor into the environment. Similarly, for a camera sensor, the light that may reach the camera sensor may be simulated as emissions from the camera to detect which objects in an environment could possibly reflect light into the camera. The emissions of each type of sensor may be simulated as emissions from the sensor. Although this disclosure provides examples with respect to lidar sensors, similar technique may be equally applied to other types of sensors. In particular embodiments, an emission simulating a light ray or light particle may be simulated to stop after making contact, or intersecting, with a first object in the environment. An angle of contact between the ray and object may be determined. If the angle of contact is within a threshold range (e.g., not too acute) it may be assumed that the light ray or light particle will reflect back to the detector portion of the sensor. This ray will be treated as an interaction or "hit" for the sensor. Once an interaction is determined, a variety of information about the object may be collected as discussed herein to assist with the modeling of the sensor. This may be useful, for example, to identify the objects or the type of objects that the sensor is able to detect in a preconstructed virtual environment. Furthermore, by simulating the emissions from a sensor using a raytracing-based approach, the simulation may detect when the field of view of the sensor is blocked. Occlusion detection may allow the simulation to detect the existence of blind spots in a sensor's field of view or in a coverage area of an arrangement of sensors. As another example, a radar sensor (or other sensor based on varying radio wave frequencies) may be modeled. The radio waves emitted by the radar sensor may be simulated as emissions into the scene originating at the sensor with properties based on the properties of the applicable radio waves. A radar sensor may use, as a detection media, waves of varying radio frequencies. The varying radio frequencies may be able to penetrate different materials before being redirected. The simulated emissions may be similarly treated based on the types of objects in the simulated environment. If a radio emission intersects with an object of a material that would stop a radio wave, an angle of incidence may be determined. The angle may be used to determine if the radio wave would return back to the simulated radar sensor. If so, a hit is registered, and metadata about the intersected object may be stored for later use. Similarly, optical sensors may be modeled by projecting one or more rays into the environment from the optical sensor and performing similar operations.

FIGS. 2A and 2B illustrate an example of a ray tracing-derived approach for modeling the capabilities of a sensor. FIG. 2A illustrates a simulated lidar sensor 205 in a virtual environment that includes a truck 220 and a pedestrian 225. FIG. 2A specifically illustrates a profile view of the virtual environment. As shown in FIG. 2A to simulate the lidar sensor 205, multiple emissions (e.g., rays or particles) are simulated as being cast from the sensor 205. A first ray 230 is cast from the sensor 205 and is determined to intersect with the pedestrian 225. A second ray 231 is cast from the sensor 205 and is determined to intersect with the truck 220. A third ray 232 is cast from the sensor 205 and is detected to not intersect with any object in the environment within a specified distance threshold. The third ray 232 may be determined to be a miss or a non-interaction because the angle of the ray relative to the ground plane was too extreme. Note that ray 230, from the profile perspective may have been capable of intersecting with the truck 220, if not for the position of the pedestrian 225 in the environment in front of the truck 220. However, because the pedestrian 225 was the first object in the environment for the ray 230 to intersect, the ray 230 does not travel further. The ability of the simulation to detect that the pedestrian is in front of the truck may improve the reliability of a model of the sensor when detecting more objects.

FIG. 2B illustrates a top-down view of the sensor 205 in the virtual environment including the truck 220 and pedestrian 225. As shown in FIG. 2B, to simulate the lidar sensor 205, multiple emissions (e.g., rays or particles) are simulated as being cast from the sensor 205. A first ray 233 is cast from the sensor 205 and is determined to intersect to the pedestrian 225. A second ray 234 is cast from the sensor 205 and is determined to intersect with the truck 220. A third ray 235 is cast from the sensor and is detected to not intersect with any object in the environment. The ray 235 may be treated as a miss or non-interaction. Note that, as with ray 230 of FIG. 2A, ray 233 may have been capable of intersecting with the truck 220 if not for the position of the pedestrian in front of the truck 220 in the environment. Because the ray 233 intersected with the pedestrian 225 as the first object in the environment, the ray 233 does not travel further. This property, that each ray may only validly intersect with a single object, allows for the detection of object occlusion. By sending multiple rays, relating to all valid angles of diffraction for the sensor, into the simulated environment, the full range of capabilities of a sensor may be estimated. In particular, adjusting the environment around the sensor may allow for detailed testing in manners not possible through physical testing, demonstrating that simulated models of sensors are a technical improvement to the field of sensor and sensor arrangement design, testing, and validation.

Figure 3:
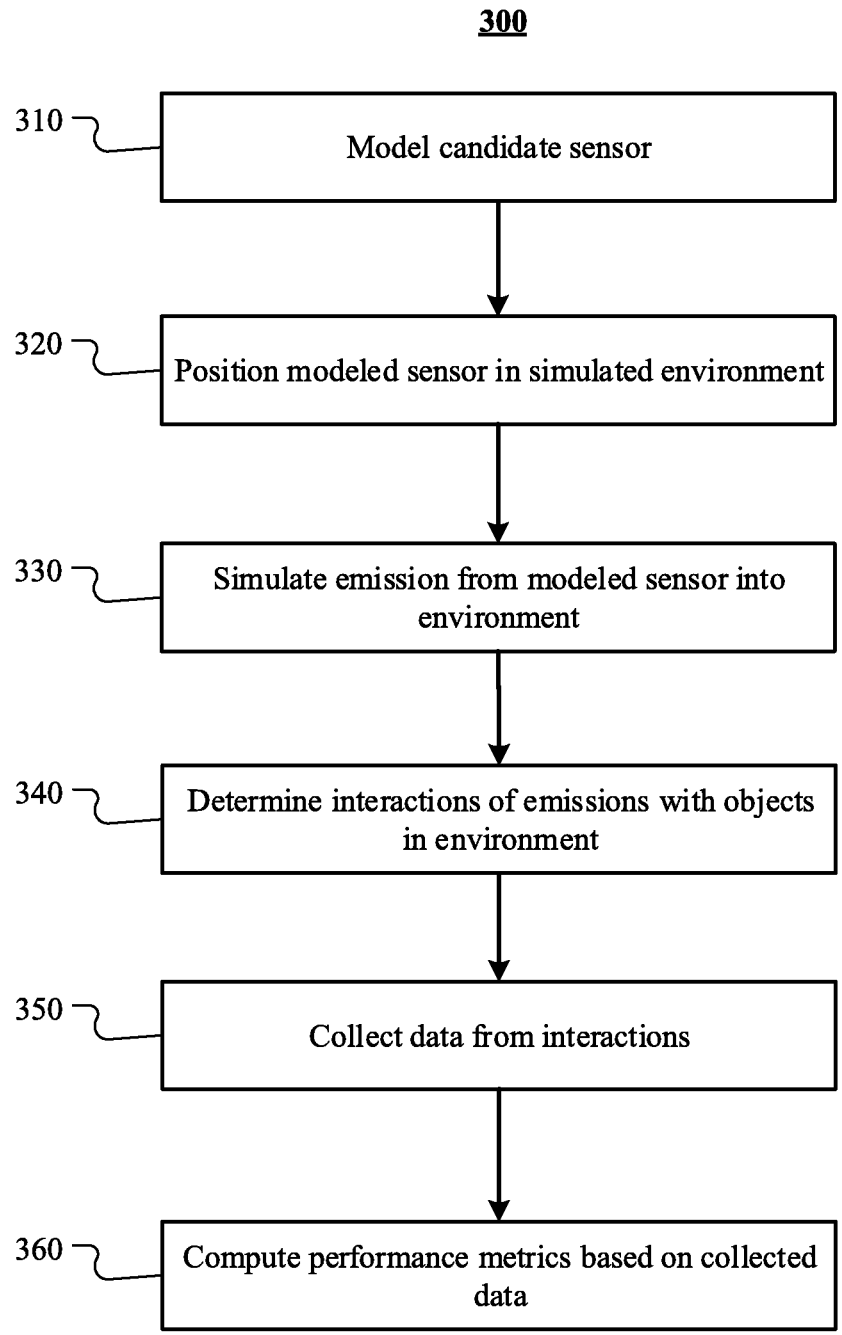
FIG. 3 illustrates an example of a method for quantifying performance of a candidate sensor in a simulated environment.

FIG. 3 illustrates an example method 300 for quantifying simulated performance of a candidate sensor in a virtual environment. The method may begin at step 310, where a computing system may model a candidate sensor. The computing system may receive performance features for the sensor. The features may be derived from performance specifications for the candidate sensors. As an example, for a candidate lidar sensor, the features may include specifications for field of view, distance, scanning rate, revolution rate, etc. Using the performance features, the computing system may generate a model of the candidate sensor. Modeling the sensor may involve modifying a template simulated sensor according to the performance specifications. At step 320, the computing system may position the modeled sensor in a simulated environment. The simulated environment may comprise a plurality of objects at varying distances from the sensor. In particular embodiments, the simulated environment may have been randomly or procedurally generated. In particular embodiments, the simulated environment may be designed to test, for example, a range of the sensor or the field of view of the sensor by strategically placing objects as targets in the environment. At step 330, the computer system may simulate sensor behavior by simulating emissions (e.g., projectiles) representing the detection media emitted from the modeled sensor into the environment. The particular emission and emission behavior may vary based on the type of sensor. For example, if the sensor is light based, the emissions may behave like light, for example, by exhibiting limited reflection for most types of materials of the objects of the environment. If the sensor is RF-based the emissions may behave like radar waves, for example, by exhibiting some level of penetration based on the material comprising the simulated object based on the frequencies of the simulated radar wave. Thus, in one example, an RF-based sensor may detect objects of a particular type of material on the other side of a blocking object of a type of material permitting penetration. In this example, the light-based sensor may only detect the blocking object. The number of emissions simulated may vary based on the performance features of the modeled sensor as well as the behavior and performance features of the emissions themselves. For example, the number of emissions sent in a particular environment or portion of the environment over a particular time may be determined based on the performance features. At step 340, the computing system may determine interactions of the emissions with objects in the environment. Interactions may be modeled as collisions of the emissions with objects in the environment. At step 350, the computing system may collect data about the interactions. The data may identify the sensor (when tested with multiple sensors at once), identify the intersected object, properties of the object, and the position of the object in the environment. Properties of the object may include physical and material properties of the object, a likelihood that the object will be detected by the sensor, or other related properties. At step 360, based on the collected data, the computing system may compute the performance metrics. The performance metrics may include quantitative metrics (e.g., field of view, beam efficiency) or qualitative metrics. The metrics may be segmented according to, for example, the type of object detected, the distance of the object from the sensor, a number of objects detected, etc. The metrics may be based on a particular object or on one or more objects in the environment. The metrics may use data from intersected objects and also objects for which no interaction was detected because the computing system is aware of the position and information regard those objects. Particular embodiments may repeat one or more steps of the method of FIG. 3, where appropriate. Although this disclosure describes and illustrates particular steps of the method of FIG. 3 as occurring in a particular order, this disclosure contemplates any suitable steps of the method of FIG. 3 occurring in any suitable order. Moreover, although this disclosure describes and illustrates an example method for quantifying simulated performance of a candidate sensor in a virtual environment including the particular steps of the method of FIG. 3, this disclosure contemplates any suitable method for quantifying simulated performance of a candidate sensor in a virtual environment including any suitable steps, which may include all, some, or none of the steps of the method of FIG. 3, where appropriate. Furthermore, although this disclosure describes and illustrates particular components, devices, or systems carrying out particular steps of the method of FIG. 3, this disclosure contemplates any suitable combination of any suitable components, devices, or systems carrying out any suitable steps of the method of FIG. 3.

Figure 4A:
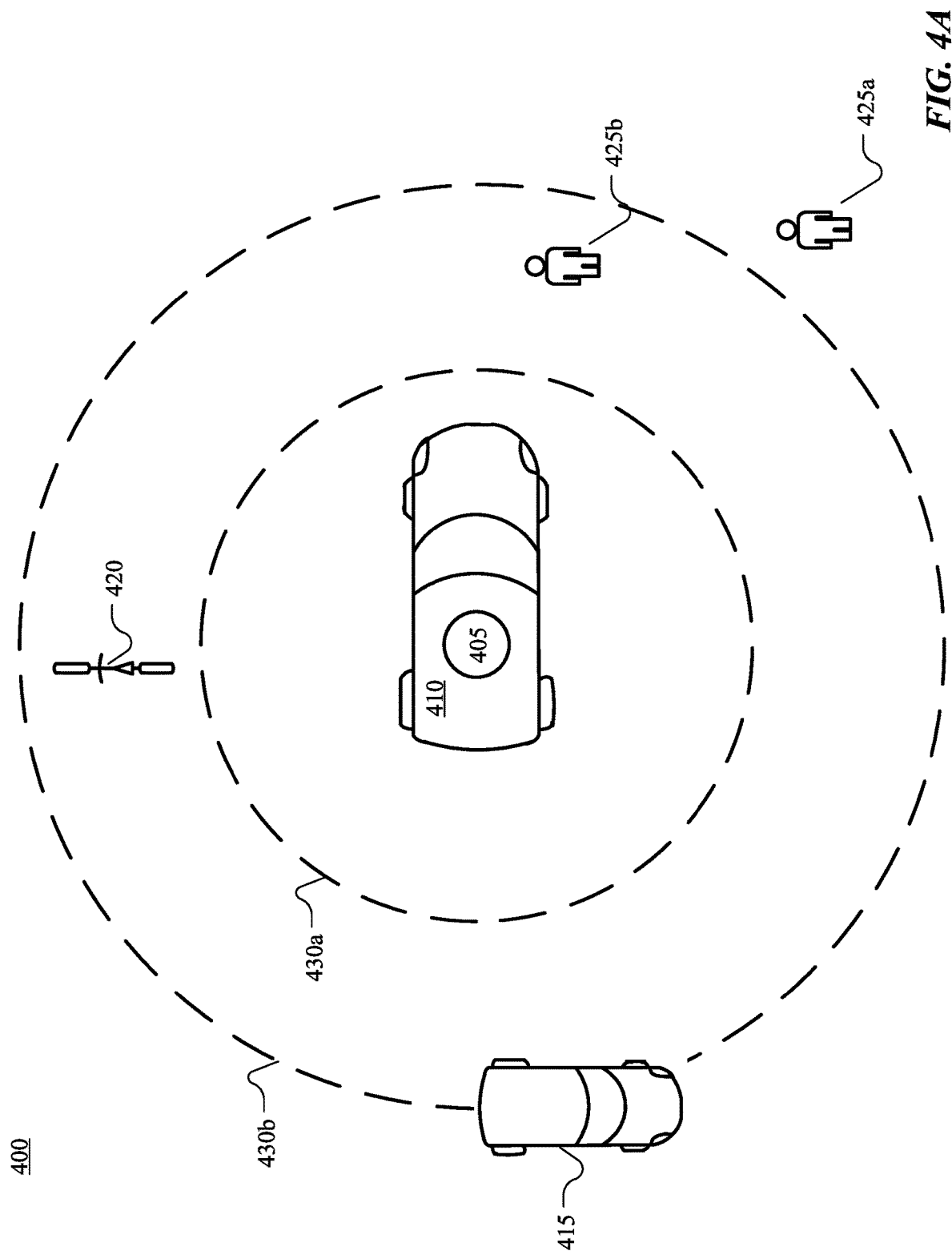

FIG. 4A illustrates an example of a simulated environment 400 for determining the performance characteristics of a sensor, simulated in a mounting position on a vehicle. The performance characteristics may include quantified performance metrics. The environment includes a vehicle 410. Coupled to the vehicle 410 is a sensor 405. The sensor 405 may be a simulated sensor that is modeled based on predetermined performance features for a candidate sensor. The vehicle 410 may be a vehicle modeled based on a particular vehicle to which the candidate sensor may be coupled. The vehicle 410 may be modeled based on a generic vehicle body to determine and compare performance between candidate sensors. The environment 400 includes other simulated objects. The simulation may determine the ability of the sensor 405 to detect the other simulated objects and to what degree of accuracy that detection is performed. The objects in the environment may include, as an example only and not by way of limitation, other vehicles (e.g., vehicle 415), bicycles (e.g., bicycle 420), pedestrians (e.g., pedestrians 425a and 425b), animals, traffic signaling equipment (e.g., stop signs and traffic lights), or any other objects that may be encountered when operating a vehicle.

The simulation may model the behavior of the sensor 405 in the environment 400. In particular embodiments, the computing system operating the simulation may use techniques described herein to simulate the behavior of the sensor 405. The techniques used may vary based on a type of the sensor. For example, if the sensor 405 is based on a candidate electromagnetic wave-based sensor (e.g., a radar), the technique used may be different than what would be used if the sensor 405 is based on a candidate lidar sensor. In particular embodiments, the technique may be similar to raytracing where emissions (e.g., rays or particles) representing light (in the case of, e.g., lidar), audio, or other electromagnetic signals (in the case of, e.g., a radar sensor) are projected from the sensor 405 in a manner according to a specification of a modeled candidate sensor.

The computing system may simulate light as an emission (e.g., ray or a particle) from the sensor 405 into the environment 400. The computing system may detect if each simulated emission intersects with or contacts an object in the environment 400. The computing system may collect metadata about the intersected object. The metadata may include information such as the identity of the object, the type of the object, dimensions of the object, position of the object relative to the simulated sensor 405, and any other suitable information. The computing system may aggregate the metadata collected from each interaction of the emissions to determine a profile of the sensors capabilities. The computing system may repeat the simulation within the same environment 400 to determine a full profile of the abilities of the sensor. In particular embodiments, the computing system may continue testing the sensor 405 by rearranging the objects in the environment 400. For example, the simulation may encompass testing the sensor 405 in each environment 400 a fixed number of times (e.g., five times). The placement of objects in the environment 400 may then be randomized or procedurally generated, and the sensor 405 may tested again be performed again.

Based on the testing, the computing system may determine a profile of the abilities of the sensor 405 in one or more configurations (e.g., when coupled with a vehicle 410 in one or more positions). For example, in the environment 400 illustrated in FIG. 4A, the simulation may result in a profile of the sensor that illustrates a fidelity of the sensor at certain benchmark ranges. These ranges may be configurable before the simulation is run as a method to determine optimal performance characteristics of the sensor. For example, in the example shown in FIG. 4A, the simulation was specified to include two benchmark ranges, illustrated by the concentric circles 430a and 430b around the sensor 405. The circle 430a may correspond to a range of 10 feet and the circle 430b may correspond to a range of 20 feet. The radius of the circles, and the range of the sensors under analysis, may be determined based on a targeted profile of the sensor for testing. As an example, the particular candidate sensor may be estimated to have a particular degree of accuracy up to a known range (e.g., 20 feet) and the simulation may be performed to confirm this accuracy in one or more sensor configurations.

Figure 4B:
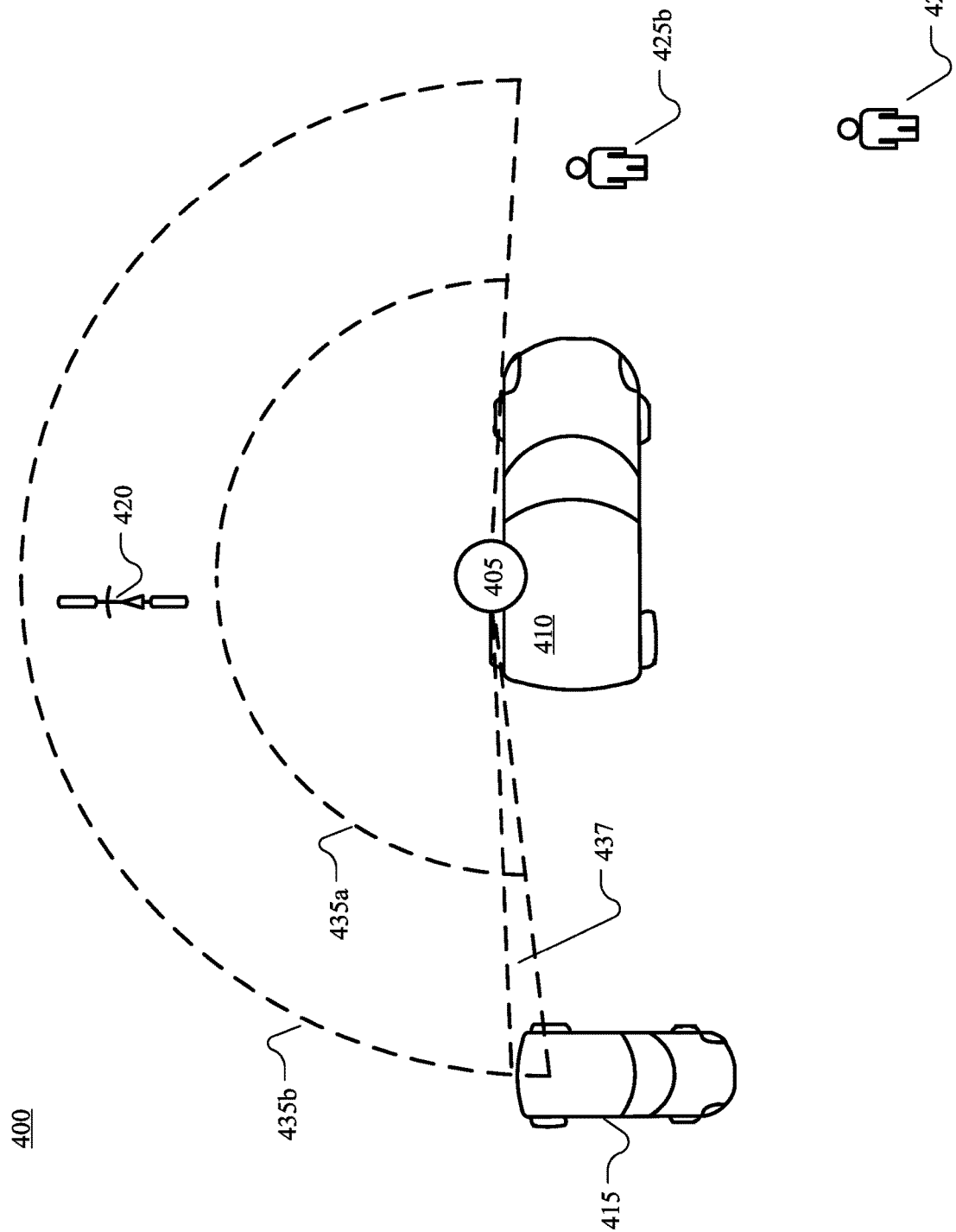

FIG. 4B illustrates a simulation for measuring the effect of a particular placement of a sensor on a vehicle. The environment 400 in FIG. 4B is the same as the environment 400 in FIG. 4A. The arrangement of objects around the vehicle 410 is also the same as shown in FIG. 4A. However, in FIG. 4B, the position of the sensor 405 relative to the vehicle 410 has been modified. The capabilities of sensor 405 may be simulated in this new position (e.g., according to the techniques described herein) and may be presented for analysis. In this example, the sensor 405 has been moved to a position to simulate a candidate sensor placed above the rear driver-side wheel-well. The arcs 435*a* and 435*b* show the results of a simulation performed to determine the field of view of the sensor 405 in this position, compared to the field of view of the sensor 405 in the roof-mounted position shown in FIG. 4A. Because the sensor 405 is mounted lower on the body of the vehicle 410, it may detect objects in the environment that are lower to the ground than a roof-mounted sensor. However, the sensor 405 may also be occluded by one or more components of the vehicle 410. This may affect the field of view of the sensor, and consequently affect its performance. For example, as shown in FIG. 4B, the field of view of the sensor 405 may be restricted by the rear of the vehicle and the front body panels of the vehicle 410. Because of the position of the sensor 405, a portion of the potential field of view of the sensor 405 (as shown, for example, in the roof-mounted position) is occluded by the vehicle body 410. Thus, the practical field of view of the sensor 405 is limited and shown by the arcs 435*a* and 435*b* which cover less of the environment than the circles 430*a* and 430*b*. One consequence of this mounting position, as shown by the simulation illustrated in FIG. 4B, is that the ability of the sensor 405 to detect particular objects in the environment may be restricted when compared to the mounting position shown in FIG. 4A. For example, only a small percentage of the potential field of view of the sensor 405 is even capable of reaching an object to the rear of the vehicle 410. As shown, only a narrow range 437 of the field of view overlaps with the vehicle 415. This may be demonstrated by the simulation, for example, by the narrow range of emissions used to generate the simulated field of view. In particular embodiments, the simulation may be interactive, which may allow a user to simulate the effect on the effective field of the view of the sensor of minute differences in the placement of the sensor 405. The operator may be able to, in real-time or near real-time, move the sensor 405 relative to the vehicle and see changes in potential occlusion and field of view. For example, a user may move the sensor 405 vertically and compare the benefits of the height of the sensor 405 on the field of view to the loss of performance in detecting lower-height objects. A user may move the sensor 405 closer to the body of the vehicle 410 or further out from the body of the vehicle 410 to compare the occlusion caused by the body of the vehicle 410 or components of the body of the vehicle. For example, through the simulation, the operator may determine that the field of view of a sensor is blocked by the door mirrors on the vehicle 410. The interactive simulation may allow persons designing arrangements of vehicle sensors to empirically test the effects of specific arrangements of sensors on a specific vehicle, limited only by the fidelity of the models for each.

Although FIGS. 4A and 4B illustrate a simulation of a single sensor 405, the simulations may be modified to test the capabilities of an arrangement of sensors. For example, FIG. 4C illustrates an arrangement of sensors 405*a* and 405*b* coupled to the vehicle 410. The sensors 405*a* and 405*b* are illustrated in the same environment used in FIGS. 4A and 4B. The capabilities of the sensors 405*a* and 405*b* may be simulated (e.g., using the techniques described herein) and may be presented for analysis. Sensor 405*a* is mounted in the same position as in the example illustrated in FIG. 4B. Thus, it has the same field of view 440*a*. Sensor 405*b* is mounted in a similar position on the opposite side of the vehicle 410. The field of view 440*b* of sensor 405*b* includes a portion of vehicle 415 and pedestrian 425*a*. However, the field of view for neither sensor includes pedestrian 425*b* because pedestrian 425*b* is positioned in a blind spot of this arrangement of sensors. A designer may use the information obtained from this simulation to redesign the sensor arrangement, e.g., by moving the placement of one or more of the sensors 405*a* and 405*b*. Visualizations, such as those shown in FIGS. 4A-4C may be output to a user of the simulation environment (e.g., to a user interface of a computing system).

Figure 5A:
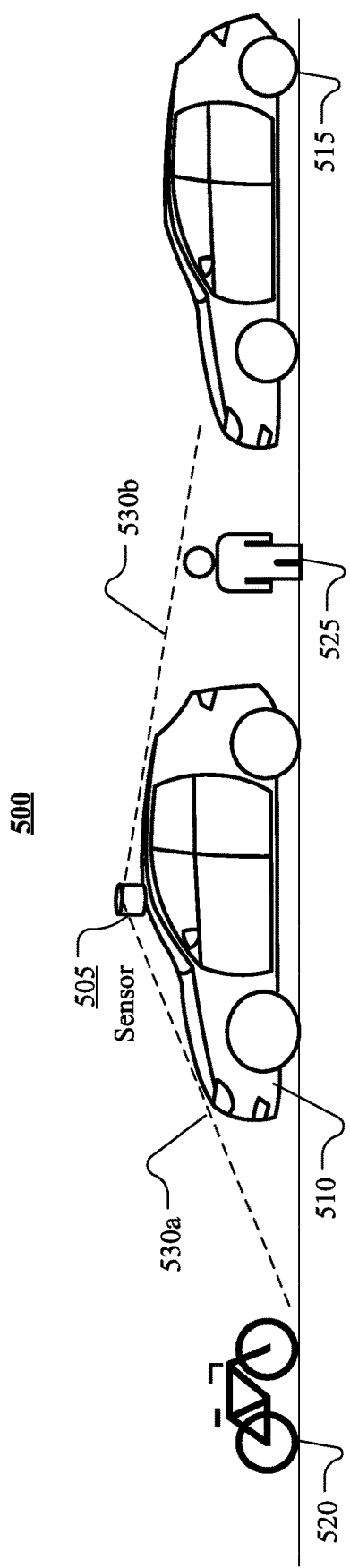
FIGS. 5A-5B illustrate an environment for determining performance characteristics of a sensor.
Figure 5B:
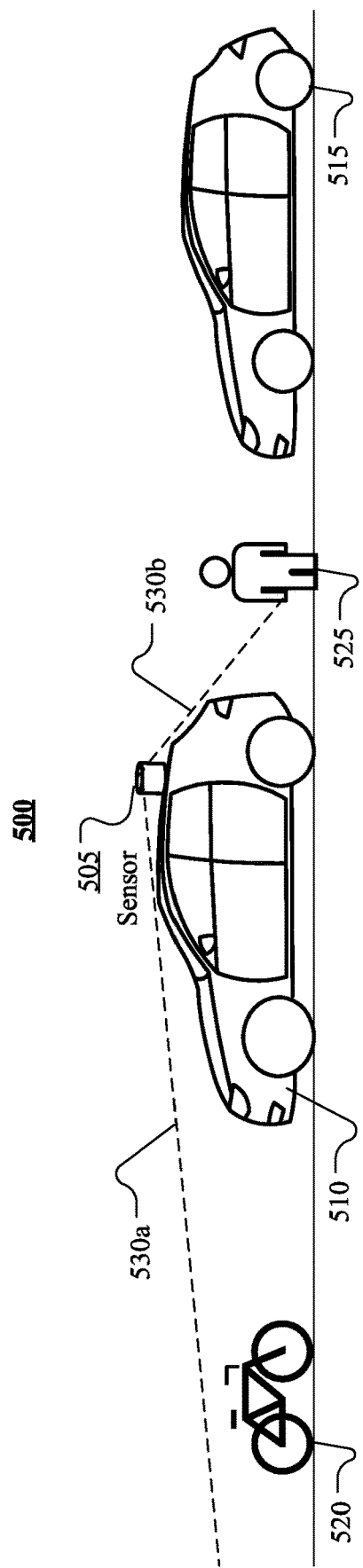

FIGS. 5A and 5B illustrate a simulation environment for determining performance characteristics of a sensor. FIGS. 5A and 5B further illustrate a simulation environment for measuring the effect of a particular positioning of a sensor. FIGS. 5A and 5B show a simulated sensor 505 coupled to a vehicle 510 (e.g., to a sensor platform of the vehicle 510) in a simulated environment 500. The capabilities of the sensor 505 may be simulated (e.g., according to the techniques described herein) and presented for analysis in a user interface (e.g., of a computing device). The visualizations of the environment 500 shown in FIGS. 5A and 5B include profile views of the vehicle 510 and the objects in the environment 500 of the vehicle 510. As with FIGS. 4A and 4B, the objects in the environment include a vehicle 515, a bicycle 520, and a pedestrian 525. The objects may include any other objects that may be encountered while operating a vehicle, such other types of vehicles, traffic signaling devices, or animals. The visualizations show the lower limits of the field of view of the sensor 505 as rays 530 and 530*b*. The profile view of the visualization allows a user to determine the ability of a sensor 505 to detect objects lower to the ground than the sensor 505. This may include a visualization of occlusion of the sensor 505 caused by the vehicle 510 based on the placement of the sensor 505 on the vehicle. As shown in FIG. 5A, the field of view of the sensor 505 includes the bicycle 520 in front of the vehicle 510 and the vehicle 515 behind the vehicle 510. However, because of the position of the sensor 505 on the vehicle 510, the sensor 505 is unable to detect the presence of the pedestrian 525 behind the vehicle. According to previous solutions, this gap in visibility caused by the placement of the sensor 505 on the vehicle 510 may be difficult, if not impossible, to detect prior to mounting a candidate sensor to a physical vehicle and testing the vehicle in the real world. The simulation therefore may reduce costs and time associated with designing sensor arrangements.

The simulation may be interactive, allowing a user to reposition the sensor 505 relative to the vehicle 510. FIG. 5B illustrates the effects of repositioning the sensor 505 in the environment 500. As illustrated in FIG. 5B, the environment 500 is the same as illustrated in FIG. 5A, the only difference being the position of the sensor 505 relative to the vehicle 510. In particular, the sensor 505 has been moved to a position towards the rear of the vehicle 510 (e.g., above the rear wheel wells). The capabilities of the sensor 505 in a new position may be simulated (e.g., according to the techniques described herein) and presented for analysis in a user interface. The simulation may be run and may show, through the rays 530a and 530b, the field of view of the sensor 505 in the new position. As shown, the field of view now includes the pedestrian 525 behind the vehicle. However, the new position of the sensor 505 has caused parts of the vehicle body to the front of the sensor 505 to block the sensor's ability to view certain objects in front of the vehicle. As shown, the field of view of the sensor no longer include the bicycle 520 in front of the sensor 505 due to occlusion caused by the vehicle 510 itself. Visualizations, such as those shown in FIGS. 5A and 5B may be output to a user of the simulation environment (e.g., to a user interface of a computing system).

In addition to determining a field of view of a sensor, the simulation may further be capable of determining other capabilities of the sensor. In particular embodiments, the simulation may calculate one or more performance metrics for the candidate sensor based on a simulated sensor. The performance metrics may also be used to measure the performance of a candidate sensor configuration (e.g., an arrangement of sensors with respect to a vehicle). As described herein, the simulation may involve simulating a detecting media (such as light) as emissions (e.g., ray or a particle) from a simulated sensor. In particular embodiments, the calculated performance metrics may include an interaction score comprising a computation of a number of beam interactions in a particular environment for a particular sensor or sensor configuration. The number of beam interactions may calculate a number of emission interactions or "hits" in the environment. This may correspond to the number of data points available to sensors in the environment. In particular embodiments, the calculated performance metrics may include a beam efficiency metric. The beam efficiency metric may comprise a ratio of beam hits to the total number of simulated beams. The efficiency metric may correspond to a number of wasted beams in a particular environment. Wasted beams correspond to areas of the environment where it is or was unnecessary for the sensor to cast beams as there were no objects present. This measure may change from environment to environment. However, because the simulation allows for the rapid development of multiple arrangements, the varied arrangements may be tested and compared. This allows for a direct comparison of arrangement performance statistics. Another efficiency metric may compare the number of beams that hit an object in the environment to the number of beams that hit the vehicle (or sensor) itself. This metric may indicate further wasted beams, as, through repositioning the sensors, beams that hit the vehicle could conceivably be used to detect objects in the environment. Thus, the performance metrics in combination with the sensor simulation environment, improve over previous methods of testing vehicle sensor arrangements, which required the sensors to be mounted to a vehicle in the candidate arrangement and either be placed in a carefully controlled environment (e.g., lab testing) or in an environment the conditions of which may vary significantly from test to test (e.g., street testing).

FIG. 6 illustrates examples of objects in a sensor simulation environment that have been struck with varying numbers of interactions from emissions from a simulated sensor. FIG. 6 serves to illustrate the interaction phenomena described above. Scenario 600a illustrates a vehicle 605 that is partially encompassed by an emission pattern 610 from a simulated sensor. Each dot of the emission pattern 610 may correspond to a single emission interaction (e.g., beam interaction, etc.) or a related cluster of emission interactions. As can be seen, only the rear portion of the vehicle 605 is covered by the emission pattern 610. Therefore, in the scenario 600a only that portion of the vehicle 605 in a similar position relative to the simulated sensor (not shown) would be projected to be detectable by a sensor in the simulated configuration. Scenario 600 illustrates the vehicle 605 is nearly totally encompassed by an emission pattern 615. Scenario 600b may correspond to a different configuration of the simulated sensor(s). Because the emission pattern 615 includes almost the entirety of the vehicle 605, the simulation may conclude that a sensor in the same configuration as being simulated (not shown) would be able to detect the entirety of the vehicle 605. Because the configuration used to generate the emission pattern 615 that detects vehicle 605 in scenario 600b includes greater coverage of the vehicle 605, the simulation may conclude that the configuration corresponding to scenario 600b is preferable to the configuration corresponding to scenario 600a.

The differences between the configurations corresponding to each of scenario 600a and 600b may include differences in the simulated physical positioning of the sensor, the number of sensors included in the configuration, sensor specifications or settings associated with each of the sensors of the configuration, different types of sensors simulated in the scenario, detection speed requirements, and many other similar factors. As an example, sensor specifications or settings that may be simulated include the number of scans permitted or amount of time allotted to each configuration of sensors during the simulation. This may be based on the speed of detection required or how quickly the object must be recognized according to a previously defined specification. Sensor settings that may be simulated may include the difference between a high performance and economy (e.g., power conserving) mode. In particular embodiments, compared simulated scenarios (e.g., 600a and 600b) may be established to directly compare the effects of changes in one or more of the factors, for example, in a direct A/B test. Multiple simulated scenarios may be generated and tested simultaneously to determine an optimal configuration based on various factors including weight, cost, power consumption, detection speed, detection reliability, and many others.

In particular embodiments, a vehicle simulation may allow a designer to configure operating scenarios that a vehicle is likely to encounter during operation. The vehicle simulation may record information during the operating scenario relating to the required performance characteristics of a sensor or sensor arrangement to allow the vehicle to navigate the scenario. In particular embodiments, particular autonomous or semi-autonomous vehicle operations may be designed that require a sensor arrangement on a vehicle that satisfies one or more threshold performance metrics. For example, an autonomous vehicle system may require a particular hit count for each object in an environment to react appropriately. The simulation may record the behavior of objects in a simulated scenario and determine, for example, a field of view of a sensor or sensor array required to satisfy the predetermined performance metric. The field of view necessary to navigate the scenario may be provided to a designer or to a system for designing candidate sensor arrangements as a quantifiable design goal. Additionally, or alternatively, any other suitable performance metric for the sensor or sensor arrangement may be used by an operating scenario simulation.

Figure 7A:
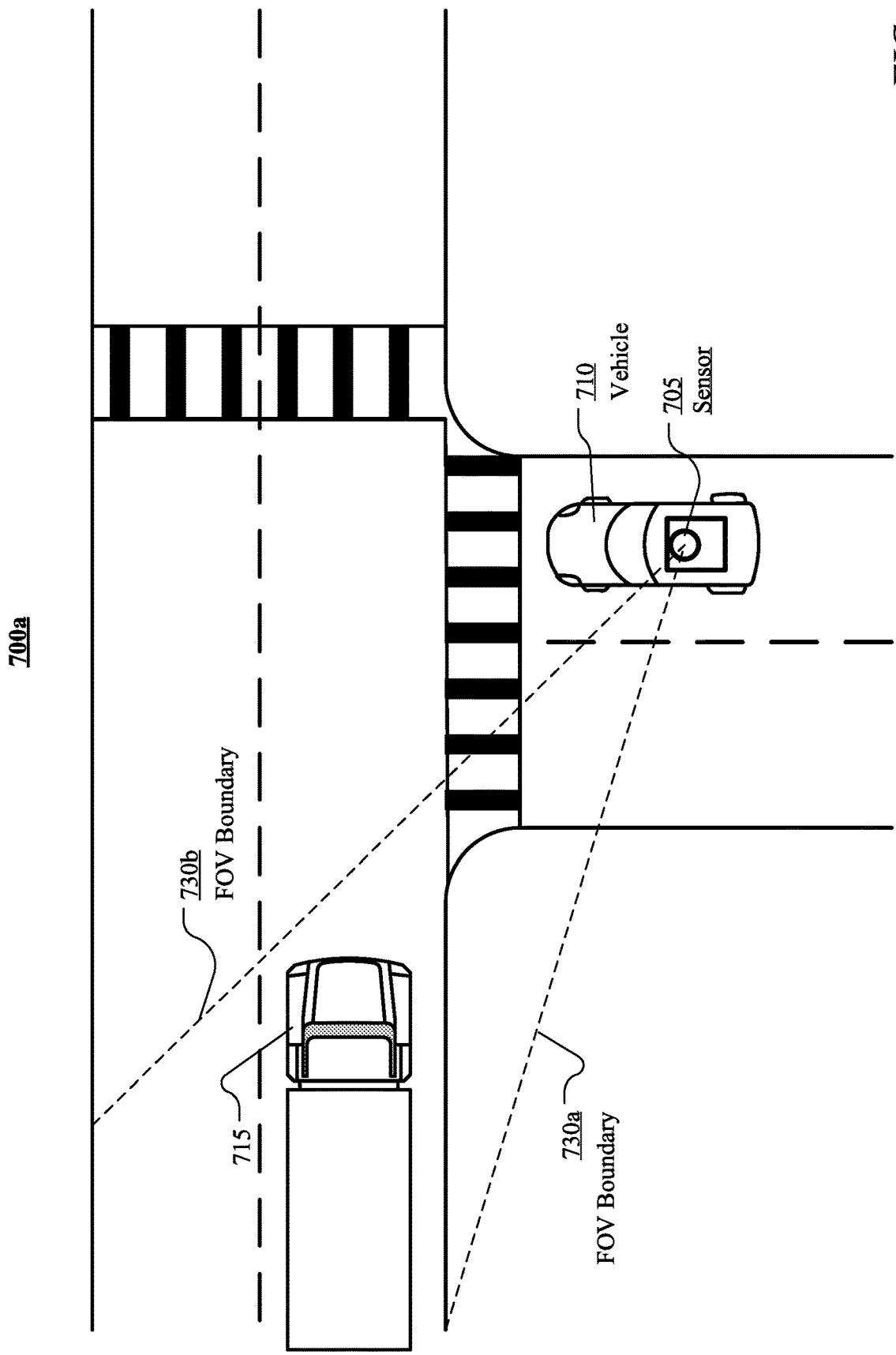
FIGS. 7A-7B illustrate simulated driving scenarios.
Figure 7B:
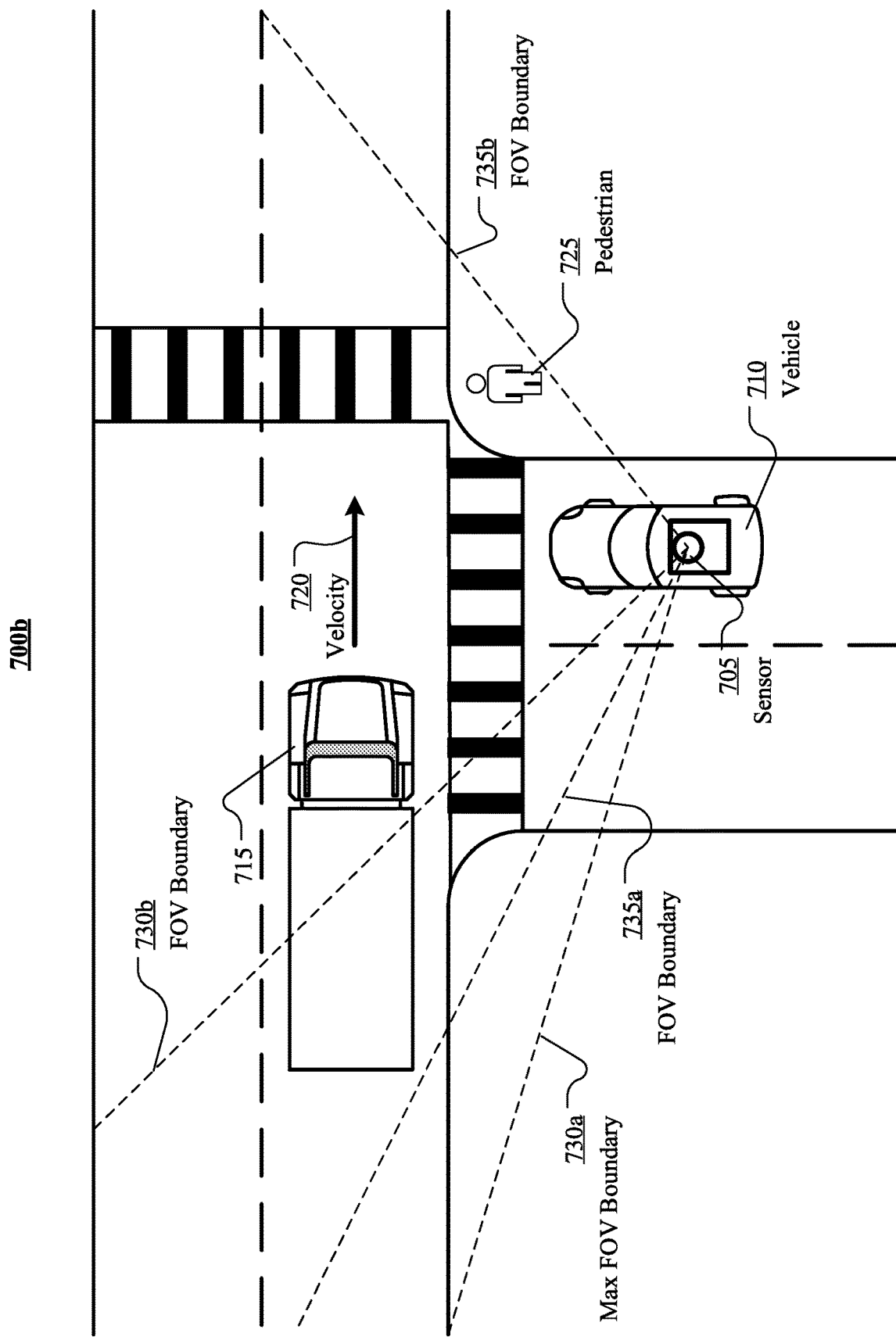

FIGS. 7A-7B illustrate example simulations of a vehicle operating scenario. FIG. 7A illustrates a first scenario in which a vehicle 710 is positioned in an environment 700a. A sensor 705 is coupled with the vehicle 710. The environment 700a includes a T-intersection. In a particular operation scenario, the vehicle 710 is attempting to make a right turn. The environment 700a also includes a truck 715 traveling down the cross street of the T-intersection in the direction the vehicle 710 seeks to turn. As part of the simulation, the sensor 705 of the vehicle 710 tracks the truck 715 to determine whether it is safe for the vehicle 710 to turn onto the cross street. In order to track the truck 715, the sensor 705 must have at least a particular field of view of the environment in the direction of the truck 715. The outer bounds of the field of view are defined by the rays 730a and 730b originating from the sensor 705. In the scenario in which the vehicle 710 and the truck 715 are stationary, the required field of view may be relatively narrow, which lowers the requirements of a sensor or sensor arrangement to satisfactorily navigate the operating scenario. However, in a scenario in which the truck 715 is in motion, the vehicle 710 is in motion, or in which there are other objects in the environment 700, the requirements for a sensor or sensor arrangement may be more complex.

FIG. 7B illustrates another vehicle operating scenario. In particular, FIG. 7B illustrates the environment 700a shown in FIG. 7B after a period of time has passed. Relative to the environment 700a, in the environment 700b shown in FIG. 7B, the truck 715 has moved further down the cross street in the direction that the vehicle 710 is attempting to turn. Furthermore, as indicated by the arrow extending from the front of the truck 715, the truck is expected to continue traveling in that direction. The path of travel of the truck 715 may be predetermined by the designer of the scenario. In particular embodiments, the path of travel may be automatically or manually generated. The movement of the truck 715 may be parameterized, allowing for the scenario to be programmed for testing in motion. Additionally, the environment 700b includes an additional object. Namely, a pedestrian 725 has entered the scenario, apparently attempting to cross the cross street of the T-intersection using the crosswalk. The sensor 705 of the vehicle 710 must be capable of tracking both the truck 715 and the pedestrian 725 to ensure that it is safe for the vehicle 710 to turn onto the cross street. The field of view of the sensor 705 required for the vehicle 710 to adequately track all relevant objects in the environment 700b in the illustrated scenario may be determined. The boundaries of the field of view required are shown in FIG. 7B as rays 735a and 735b.

Using information collected during the first stage of the scenario (e.g., shown in environment 700a) and the second stage of the scenario (e.g., shown in environment 700b), and in other stages of the scenario (which have not been included for this example but may be specified as needed), the computing system operating the simulation may determine and record a field of view necessary for the vehicle to navigate the entire operating scenario. In a first example, the system may only determine and record the field of view on a moment-to-moment basis, treating each specified stage of the scenario independently. Thus, for each stage of the simulation (e.g., environment 700a and 700b), the system may record the field of view. For example, the system may record the field of view bounded by the rays 730a and 730b for the stage illustrated in FIG. 7A and may record the field of view bounded by the rays 735a and 735b for the stage illustrated in FIG. 7B. In a second example, the system may determine and record the maximum field of view for the entire scenario. Thus, for the example shown in FIGS. 7A-7B, the system may record the field of view bounded by the rays 730a and 735b, which represent the maximum range needed. The system may additionally store the fields of view needed for subsidiary stages of the scenario. In addition to using a field of view to evaluate the performance capabilities required to successfully handle a given scenario, other performance metrics, including those discussed herein, may be recorded.

In particular embodiments, a vehicle simulation may allow a designer to configure operating scenarios that a vehicle is likely to encounter during operation and test a particular sensor configuration in the operating scenario. A designer may specify a particular sensor configuration (e.g., an arrangement of sensors, a choice of types of sensors, etc.) for testing. The sensor configuration may be determined by or with the assistance of the simulations described herein. The sensor configuration may be simulated in the vehicle operating scenario simulation. While the vehicle operating scenario runs, simulated emissions from the specified sensor configuration (including, for example, the particular settings and specifications associated with one or more sensors) may be used to evaluate the performance of the sensor configuration in the vehicle operating scenario. Thus, the vehicle operating scenarios may allow for an arbitrary sensor configuration to be tested in simulations approximating real-world operating scenarios. The sensor configuration may then be evaluated along various performance metrics including, but not limited to, number of hits, number of hits compared to a specified threshold, operative field of view, object area coverage (the percentage of the surface area of an object exposed to the sensor configuration that emissions from the configuration actually covered), hit efficiency (the number of emissions compared to the number that hit an object), etc. The vehicle operating scenarios may help to identify more qualitative measures that previously could not be discerned until a sensor is mounted to a physical vehicle and tested. Those qualitative measures many include factors like sensor (and sensor configuration) blind spots, interference or overlap between sensors, power consumption, and other difficult to detect performance issues. Multiple sensor configurations may be compared in a given scenario to allow for direct comparison of performance metrics. Additionally, one or more sensor configurations may be tested in multiple scenarios to allow the simulation to evaluate the one or more sensor configurations on the whole. Thus, the simulations may be used to significantly decrease the design and testing of sensor configuration arrangements, allowing the entire process to become more iterative in nature at a rate that previously would not be possible with merely physical validation or one-off sensor specification testing.

In particular embodiments, results of simulation testing may be validated by physical testing of sensor components mounted to a vehicle at positions indicated by the results of the simulation. Physical validation may be performed, for example, ensure the accuracy of the simulation and the accuracy of the sensors. The candidate sensors, upon which modeled sensors are based, may be physically mounted to the vehicle used as the base for the simulations. The mounted sensors may be subjected to testing to validate the results of the simulation. This testing may comprise positioning the vehicle and sensors in a testing environment and performing diagnostic tests on the metrics measured during simulation (e.g., field of view, beam efficiency, etc.). Physical validation in this manner may require precise measurements to ensure that the sensors are mounted at the proper location (the location specified in the simulation). While possible, the exacting nature of the mounting process may take considerable time, causing delays in the design of new sensor components and sensor arrangements. In particular embodiments, to improve the speed and efficiency of physical validation testing, the target vehicle may be modified so that locations of the vehicle body encompass pegboard-like mounting apparatus having precise, discrete, and regular mounting positions for attaching sensors to the vehicle. The pegboard mounting structure may be replicated in the model of the vehicle used during simulation. Furthermore, the potential positions of the sensors in the simulation may be restricted to mounting positions made available by the pegboard mounting structure. When both the physical vehicle and the simulated vehicle encompass corresponding pegboard mounting structures, the process of mounting sensors for physical validation may be improved significantly. The speed and accuracy of mounting sensors is improved at least because the discrete mounting positions greatly reduce the exposure of the process to small mounting errors that may cascade through the validation process. After physical validation is performed, the results may be used to improve the simulation suite generally and to improve the design of a particular sensor mounting configuration particularly. The use of pegboard-like mounting structures improves the speed and accuracy of this highly iterative process.

Figure 8:
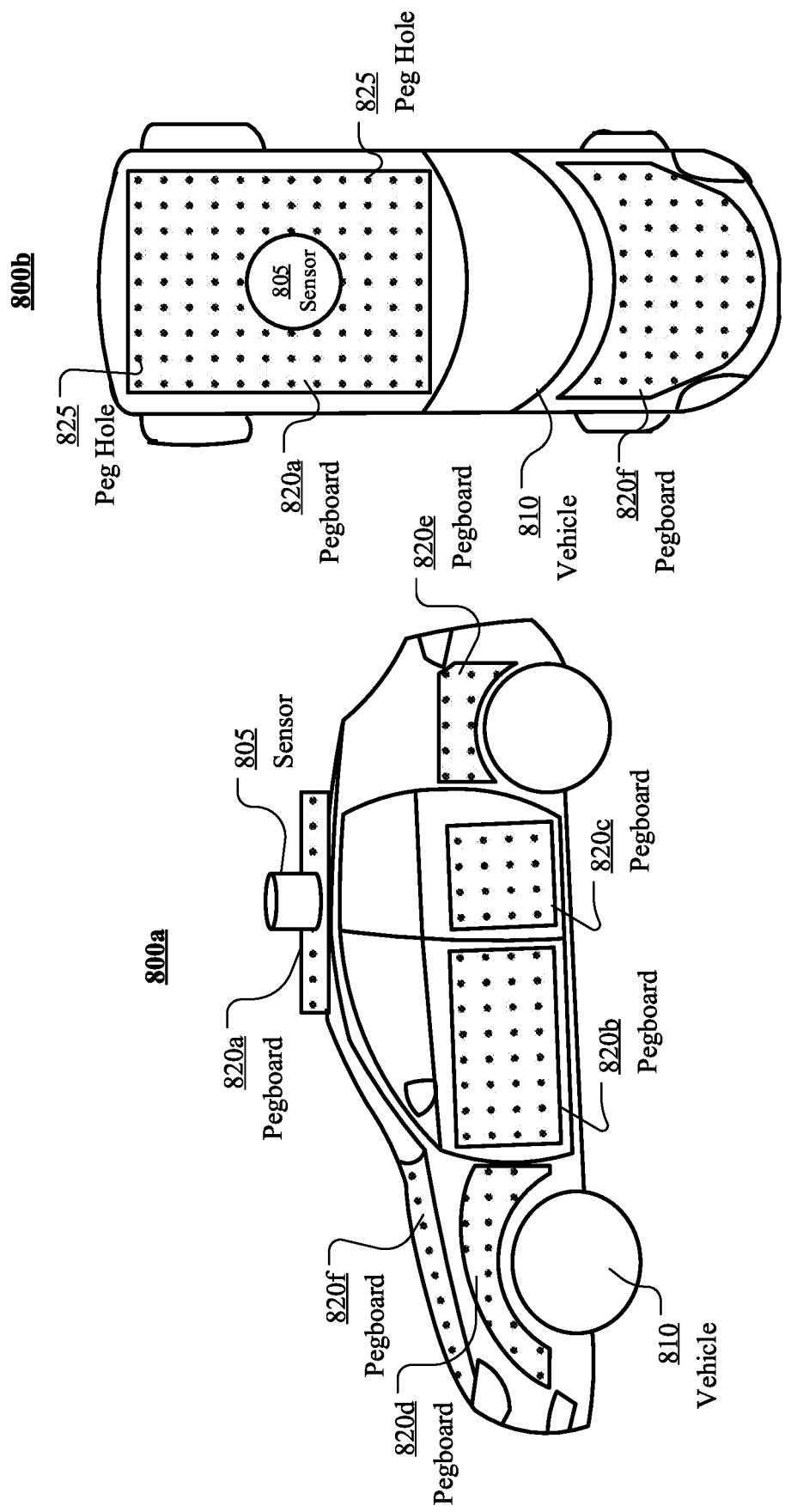
FIG. 8 illustrate a vehicle to which sensors may be mounted.

FIG. 8 illustrates an example vehicle 810 that has been modified to include several components comprising a pegboard-like apparatus having precise, discrete, and regular mounting positions for attaching sensors to the vehicle 810. FIG. 8 specifically shows two views 800a and 800b of the vehicle 810. View 800a shows a side view of the vehicle 810. View 800b shows a top-down perspective of the vehicle 810. Mounted to the roof of the vehicle 810 is a pegboard 820a. Pegboard 820a may be a sensor platform for sensors of the vehicle 810. Coupled to pegboard 820a is a sensor 805, visible in both the profile view 800a and the top-down view 800b. The sensor 805 may be attached to the pegboard 820a using one or more of the peg holes 825 that line the pegboard 820a. Vehicle 810 includes several other pegboards. For example, pegboard 820b is attached to the front door of the vehicle 810. Pegboard 820c is attached to the rear door of the vehicle 810. Pegboard 820d encompasses a section of the vehicle 810 body above the front wheel well, while pegboard 820e encompasses a section of the vehicle 810 above the rear wheel well. Pegboard 820f is located on the hood of the vehicle 810. The locations of the pegboards 820a-720f are merely illustrative. A vehicle 810 may include more or fewer pegboards 820a-720f in the same or different locations, as needed and based on the vehicle type. Moreover, the pegboards 820a-720f may be designed to be easily removed, to facilitate mounting and removing sensors (e.g., sensor 830) and to allow for pegboards to be swapped between vehicle 810.

The individual techniques described herein may be combined into a single, coherent process for designing, prototyping, and testing vehicle sensors and sensor arrangements. A simulated vehicle may be exposed to a variety of simulated driving scenarios. The driving scenarios may be constructed by a designer to approximate a wide array of situations that a vehicle may encounter during autonomous or semi-autonomous operation. A series of requirements for a sensor or array of sensors of the vehicle may be determined through the driving scenarios. These may be quantified into one or more values, such as composite scores for the sensor based on factors such as field of view, hit score, beam efficiency, etc. A sensor that is being considered for use with a vehicle, e.g., a candidate sensor, may be modeled based on performance specifications for the sensor. The simulated sensors may be designed to perform, in a virtual environment, in a manner similar to how the candidate sensor would perform in a physical environment. A model of a vehicle for which the candidate sensor is being considered may also be developed. The model may be an accurate representation of the dimensions and components of the vehicle. The vehicle, and the model of the vehicle may be modified to include portions of a pegboard-like mounting structure attached to the body of the vehicle. The simulated sensor may be coupled to a sensor platform of the vehicle specified according to a position in the pegboard mounting structure. The vehicle and simulated sensor may be placed within one or more virtual environments that may reflect possible scenarios that the vehicle may encounter while in autonomous or semi-autonomous operation. The virtual environments may be randomly or procedurally generated to provide for a thorough analysis of the abilities of the sensor. Through this testing, a series of performance metrics may be determined. It may be determined by comparison of the determined performance metrics to the performance requirements earlier derived through the simulated driving scenarios, whether a sensor or sensor arrangement is a suitable candidate for physical testing. If needed, a designer may manipulate the choice or position of sensors and continue benchmarking the performance of the sensor or sensor arrangement until the performance requirements appear likely to be satisfied. Using the positions of the pegboard mounting structure on the simulated vehicle, the candidate sensor may be mounted to the vehicle without the precise measurements ordinarily required when mounting a sensor to a vehicle. The performance of the candidate sensor may then be validated using physical testing. The value of the simulations in this process includes that iteration and completeness of testing may be performed virtually, which can be accomplished much more quickly than in a process using only physical testing. Furthermore, the use of quantified performance metrics and benchmarks provides clear goals and may inform more focused designed choices.

Figure 9:
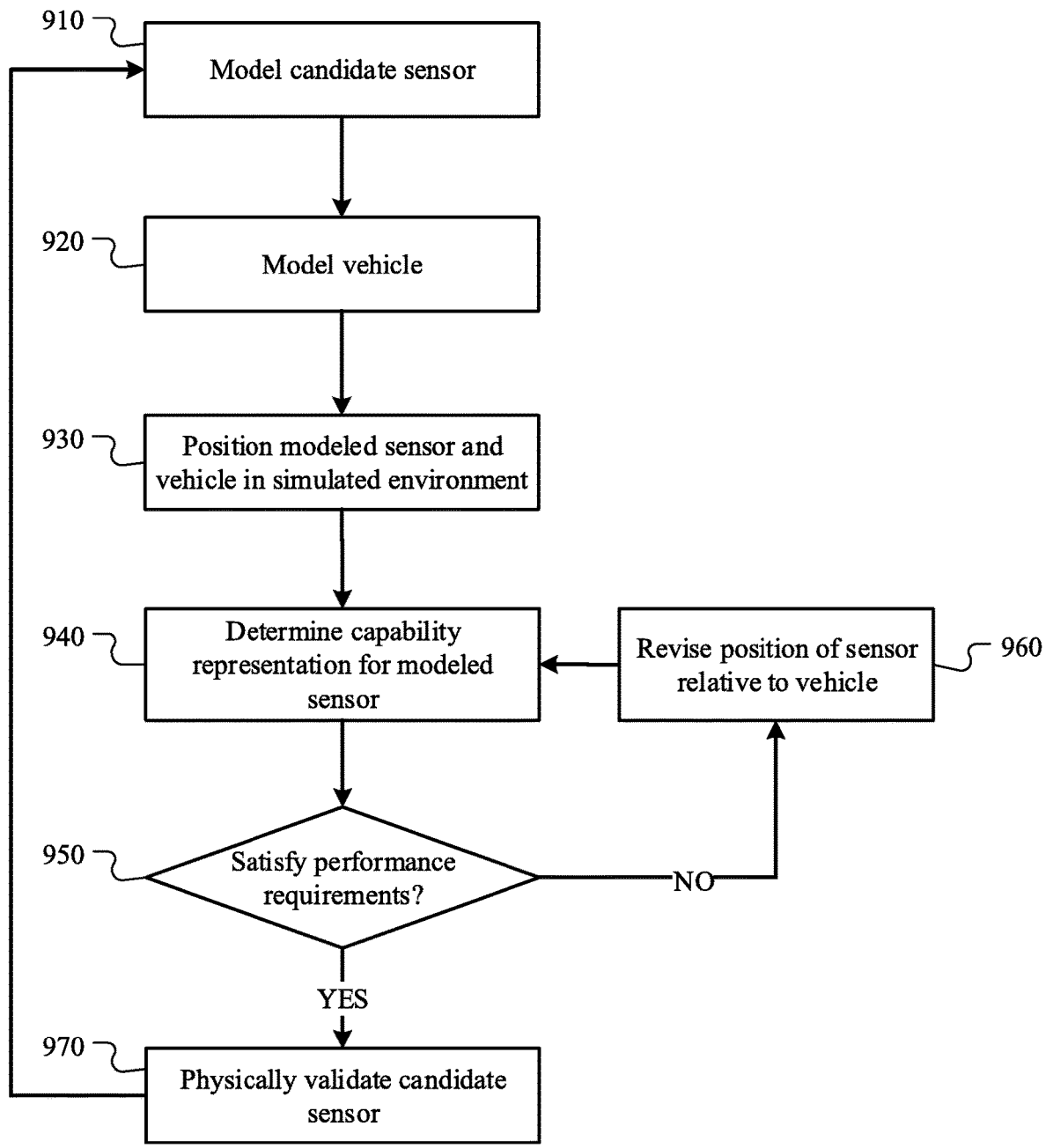
FIG. 9 illustrates an example of a method for designing and testing a candidate sensor for a target vehicle.

FIG. 9 illustrates an example method 900 for designing and testing use of a candidate sensor for a target vehicle. The method may begin at step 910, where a computing system may model a candidate sensor. The computing system may receive performance features for a candidate sensor. The features may be described in performance specifications for the candidate sensors. As an example, for a candidate lidar sensor, the performance specifications may include specifications for field of view, distance, scanning rate, revolution rate, etc. Using the received performance specifications, the computing system may generate a model of the candidate sensor. Modeling the sensor may involve modifying a template simulated sensor according to the performance specifications. At step 920, the computing system may model a target vehicle. The target vehicle may a physical vehicle for which the candidate sensor is being considered. The model of the target vehicle may be carefully calibrated to match the specifications of the target vehicle. In particular embodiments, the target vehicle may comprise one or more simplified mounting structures, such as a pegboard-like mounting structure. The model of the target vehicle may match the arrangement of the mounting structures. At step 930, the computing system may position the modeled sensor and vehicle in a simulated environment. The position of the modeled sensor and vehicle in the simulated environment may be based on a placement indicator for the sensor or vehicle. In particular embodiments, the placement indicator may be generated by the simulation. The placement indicator may be received from a user of the simulation. The simulated environment may comprise a plurality of objects at varying distances from the sensor. In particular embodiments, the simulated environment may have been randomly or procedurally generated. In particular embodiments, the simulated environment may be designed to test a range of the sensor or the field of view of the sensor by strategically placing objects as targets in the environment. In positioning the modeled sensor and the modeled vehicle, the computing system may specify a relative position of the modeled sensor and modeled vehicle. At step 940, the computing system may determine a representation of the capability of modeled sensor. The capability representation may be determined using the techniques described herein. For example, the capability representation may comprise one or more performance metrics for the modeled sensor. The capability representation may comprise one or more visualizations or visual representations of the behavior of the sensor in the environment. The capability representation may comprise a visual representation or visualization of one or more simulated emissions into the simulated environment. At step 950, the computing system may determine whether the performance metrics satisfy pre-set performance requirements. As an example, performance requirements may be determined according to simulated driving scenarios as described herein. If the performance metrics do not satisfy the performance requirements, at step 960, the position of the sensor relative to the vehicle may be revised. In addition to revising the position of the sensor, other properties related to the sensor may be revised. If the performance metrics satisfy the performance requirements, at step 970, the system may recommend physical validation of the sensor. Physical validation may include installing the candidate sensor to the target vehicle, performing additional testing, and collecting data about the real-world sensor performance. After physical validation is performed, the process may return to step 910, where the process returns to modeling the sensor based data received during the real-world physical validation of the sensor performance in step 970. Although the steps of this method refer to a single sensor, the same approach may be used to design and test use of an arrangement of candidate sensors for a target vehicle. In doing so, at step 960, the position of one or more of the sensors of the arrangement of sensors may be revised. Particular embodiments may repeat one or more steps of the method of FIG. 9, where appropriate. Although this disclosure describes and illustrates particular steps of the method of FIG. 9 as occurring in a particular order, this disclosure contemplates any suitable steps of the method of FIG. 9 occurring in any suitable order. Moreover, although this disclosure describes and illustrates an example method for designing and testing use of a candidate sensor for a target vehicle including the particular steps of the method of FIG. 9, this disclosure contemplates any suitable method for designing and testing use of a candidate sensor for a target vehicle including any suitable steps, which may include all, some, or none of the steps of the method of FIG. 9, where appropriate. Furthermore, although this disclosure describes and illustrates particular components, devices, or systems carrying out particular steps of the method of FIG. 9, this disclosure contemplates any suitable combination of any suitable components, devices, or systems carrying out any suitable steps of the method of FIG. 9.

As discussed herein, the vehicle for which sensors may be evaluated using the described techniques may include an autonomous or semi-autonomous vehicle. The vehicle may be equipped with an array of sensors, a navigation system, and a ride-service computing device. In particular embodiments, a fleet of autonomous vehicles may be managed by a transportation management system. The fleet of autonomous vehicles, in whole or in part, may be owned by the entity associated with the transportation management system, or they may be owned by a third-party entity relative to the transportation management system. In either case, the transportation management system may control the operations of the autonomous vehicles, including, e.g., dispatching select vehicles to fulfill ride requests issued by customers, instructing the vehicles to perform select operations (e.g., head to a service center or charging/fueling station, pull over, stop immediately, self-diagnose, lock/unlock compartments, change music station, change temperature, and any other suitable operations), and instructing the vehicles to enter select operation modes (e.g., operate normally, drive at a reduced speed, drive under the command of human users, and any other suitable operational modes).

In particular embodiments, the vehicles may receive data from and transmit data to the transportation management system and a third-party system. Examples of received data may include, e.g., instructions, new software or software updates, maps, 3D models, trained or untrained machine-learning models, location information (e.g., location of the ride requestor, the autonomous vehicle itself, other autonomous vehicles, and target destinations such as service centers), navigation information, traffic information, weather information, entertainment content (e.g., music, video, and news) ride requestor information, ride information, and any other suitable information. Examples of data transmitted from the autonomous vehicle may include, e.g., telemetry and sensor data, determinations/decisions based on such data, vehicle condition or state (e.g., battery/fuel level, tire and brake conditions, sensor condition, speed, odometer, etc.), location, navigation data, passenger inputs (e.g., through a user interface in the vehicle, passengers may send/receive data to the transportation management system and/or third-party system), and any other suitable data. This data may be used as feedback to the simulations, informing the choice of performance metrics or affecting the design of simulated driving scenarios.

In particular embodiments, vehicles may also communicate with each other, whether autonomous or traditional human-driven vehicles, including those managed and not managed by the transportation management system. For example, one vehicle may communicate with another vehicle data regarding their respective location, condition, status, sensor reading, and any other suitable information. In particular embodiments, vehicle-to-vehicle communication may take place over direct short-range wireless connection (e.g., WI-FI™, Bluetooth™, NFC) and/or over a network (e.g., the Internet or via the transportation management system or third-party system).

In particular embodiments, a vehicle may include a variety of sensors for capturing and processing sensor or telemetry data. For example, the vehicle may have aa Light Detection and Ranging (LiDAR) sensor array of multiple LiDAR transceivers that are configured to rotate 360°, emitting pulsed laser light and measuring the reflected light from objects surrounding vehicle. In particular embodiments, LiDAR transmitting signals may be steered by use of a gated light valve, which may be a MEMs device that directs a light beam using the principle of light diffraction. Such a device may not use a gimbaled mirror to steer light beams in 360° around the autonomous vehicle. Rather, the gated light valve may direct the light beam into one of several optical fibers, which may be arranged such that the light beam may be directed to many discrete positions around the autonomous vehicle. Thus, data may be captured in 360° around the autonomous vehicle, but no rotating parts may be necessary. A LiDAR is an effective sensor for measuring distances to targets, and as such may be used to generate a three-dimensional (3D) model of the external environment of the autonomous vehicle. As an example and not by way of limitation, the 3D model may represent the external environment including objects such as other cars, curbs, debris, objects, and pedestrians up to a maximum range of the sensor arrangement (e.g., 50, 100, or 200 meters). As another example, the autonomous vehicle may have optical cameras pointing in different directions. The cameras may be used for, e.g., recognizing roads, lane markings, street signs, traffic lights, police, other vehicles, and any other visible objects of interest. To enable the vehicle to "see" at night, infrared cameras may be installed. In particular embodiments, the vehicle may be equipped with stereo vision for, e.g., spotting hazards such as pedestrians or tree branches on the road. As another example, the vehicle may have radars for, e.g., detecting other vehicles and/or hazards afar. Furthermore, the vehicle may have ultrasound equipment for, e.g., parking and obstacle detection. In addition to sensors enabling the vehicle to detect, measure, and understand the external world around it, the vehicle may further be equipped with sensors for detecting and self-diagnosing the vehicle's own state and condition. For example, the vehicle may have wheel sensors for, e.g., measuring velocity; global positioning system (GPS) for, e.g., determining the vehicle's current geolocation; and/or inertial measurement units, accelerometers, gyroscopes, and/or odometer systems for movement or motion detection. While the description of these sensors provides particular examples of utility, one of ordinary skill in the art would appreciate that the utilities of the sensors are not limited to those examples. Further, while an example of a utility may be described with respect to a particular type of sensor, it should be appreciated that the utility may be achieved using any combination of sensors. For example, an autonomous vehicle may build a 3D model of its surrounding based on data from its LiDAR, radar, sonar, and cameras, along with a pre-generated map obtained from the transportation management system or the third-party system. These sensors may all be modeled and simulated according to the techniques described herein.

In particular embodiments, vehicles may be equipped with a processing unit (e.g., one or more CPUs and GPUs), memory, and storage. The vehicle may thus be equipped to perform a variety of computational and processing tasks, including processing the sensor data, extracting useful information, and operating accordingly. For example, based on images captured by its cameras and a machine-vision model, the vehicle may identify particular types of objects captured by the images, such as pedestrians, other vehicles, lanes, curbs, and any other objects of interest.

Figure 10:
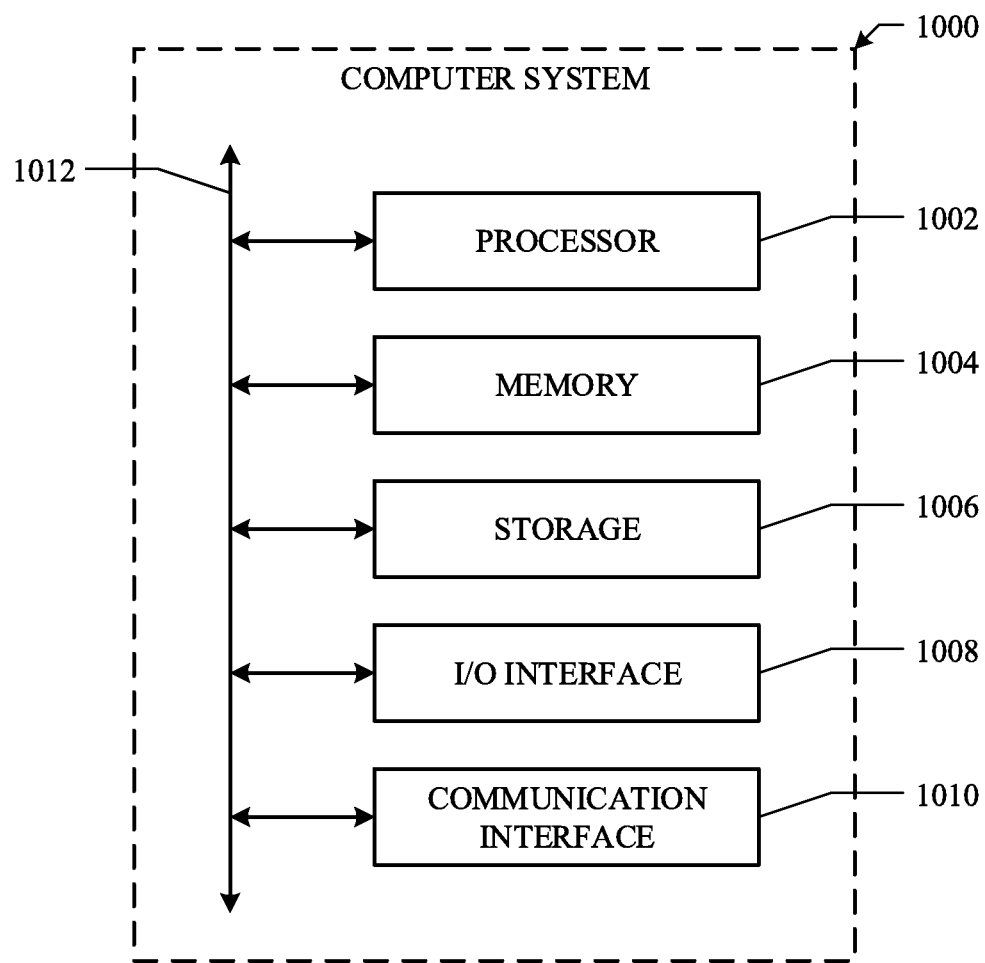
FIG. 10 illustrates an example of a computing system.

FIG. 10 illustrates an example computer system 1000. In particular embodiments, one or more computer systems 1000 perform one or more steps of one or more methods described or illustrated herein. In particular embodiments, one or more computer systems 1000 provide the functionalities described or illustrated herein. In particular embodiments, software running on one or more computer systems 1000 performs one or more steps of one or more methods described or illustrated herein or provides the functionalities described or illustrated herein. Particular embodiments include one or more portions of one or more computer systems 1000. Herein, a reference to a computer system may encompass a computing device, and vice versa, where appropriate. Moreover, a reference to a computer system may encompass one or more computer systems, where appropriate.

This disclosure contemplates any suitable number of computer systems 1000. This disclosure contemplates computer system 1000 taking any suitable physical form. As example and not by way of limitation, computer system 1000 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 1000 may include one or more computer systems 1000; be unitary or distributed; span multiple locations; span multiple machines; span multiple data centers; or reside in a cloud, which may include one or more cloud components in one or more networks. Where appropriate, one or more computer systems 1000 may perform without substantial spatial or temporal limitation one or more steps of one or more methods described or illustrated herein. As an example and not by way of limitation, one or more computer systems 1000 may perform in real time or in batch mode one or more steps of one or more methods described or illustrated herein. One or more computer systems 1000 may perform at different times or at different locations one or more steps of one or more methods described or illustrated herein, where appropriate.

In particular embodiments, computer system 1000 includes a processor 1002, memory 1004, storage 1006, an input/output (I/O) interface 1008, a communication interface 1010, and a bus 1012. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1002 includes hardware for executing instructions, such as those making up a computer program. As an example and not by way of limitation, to execute instructions, processor 1002 may retrieve (or fetch) the instructions from an internal register, an internal cache, memory 1004, or storage 1006; decode and execute them; and then write one or more results to an internal register, an internal cache, memory 1004, or storage 1006. In particular embodiments, processor 1002 may include one or more internal caches for data, instructions, or addresses. This disclosure contemplates processor 1002 including any suitable number of any suitable internal caches, where appropriate. As an example and not by way of limitation, processor 1002 may include one or more instruction caches, one or more data caches, and one or more translation lookaside buffers (TLBs). Instructions in the instruction caches may be copies of instructions in memory 1004 or storage 1006, and the instruction caches may speed up retrieval of those instructions by processor 1002. Data in the data caches may be copies of data in memory 1004 or storage 1006 that are to be operated on by computer instructions; the results of previous instructions executed by processor 1002 that are accessible to subsequent instructions or for writing to memory 1004 or storage 1006; or any other suitable data. The data caches may speed up read or write operations by processor 1002. The TLBs may speed up virtual-address translation for processor 1002. In particular embodiments, processor 1002 may include one or more internal registers for data, instructions, or addresses. This disclosure contemplates processor 1002 including any suitable number of any suitable internal registers, where appropriate. Where appropriate, processor 1002 may include one or more arithmetic logic units (ALUs), be a multi-core processor, or include one or more processors 1002. Although this disclosure describes and illustrates a particular processor, this disclosure contemplates any suitable processor.

In particular embodiments, memory 1004 includes main memory for storing instructions for processor 1002 to execute or data for processor 1002 to operate on. As an example and not by way of limitation, computer system 1000 may load instructions from storage 1006 or another source (such as another computer system 1000) to memory 1004. Processor 1002 may then load the instructions from memory 1004 to an internal register or internal cache. To execute the instructions, processor 1002 may retrieve the instructions from the internal register or internal cache and decode them. During or after execution of the instructions, processor 1002 may write one or more results (which may be intermediate or final results) to the internal register or internal cache. Processor 1002 may then write one or more of those results to memory 1004. In particular embodiments, processor 1002 executes only instructions in one or more internal registers or internal caches or in memory 1004 (as opposed to storage 1006 or elsewhere) and operates only on data in one or more internal registers or internal caches or in memory 1004 (as opposed to storage 1006 or elsewhere). One or more memory buses (which may each include an address bus and a data bus) may couple processor 1002 to memory 1004. Bus 1012 may include one or more memory buses, as described in further detail below. In particular embodiments, one or more memory management units (MMUs) reside between processor 1002 and memory 1004 and facilitate accesses to memory 1004 requested by processor 1002. In particular embodiments, memory 1004 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1004 may include one or more memories 1004, where appropriate. Although this disclosure describes and illustrates particular memory, this disclosure contemplates any suitable memory.

In particular embodiments, storage 1006 includes mass storage for data or instructions. As an example and not by way of limitation, storage 1006 may include a hard disk drive (HDD), a floppy disk drive, flash memory, an optical disc, a magneto-optical disc, magnetic tape, or a Universal Serial Bus (USB) drive or a combination of two or more of these. Storage 1006 may include removable or non-removable (or fixed) media, where appropriate. Storage 1006 may be internal or external to computer system 1000, where appropriate. In particular embodiments, storage 1006 is non-volatile, solid-state memory. In particular embodiments, storage 1006 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1006 taking any suitable physical form. Storage 1006 may include one or more storage control units facilitating communication between processor 1002 and storage 1006, where appropriate. Where appropriate, storage 1006 may include one or more storages 1006. Although this disclosure describes and illustrates particular storage, this disclosure contemplates any suitable storage.

In particular embodiments, I/O interface 1008 includes hardware, software, or both, providing one or more interfaces for communication between computer system 1000 and one or more I/O devices. Computer system 1000 may include one or more of these I/O devices, where appropriate. One or more of these I/O devices may enable communication between a person and computer system 1000. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1008 for them. Where appropriate, I/O interface 1008 may include one or more device or software drivers enabling processor 1002 to drive one or more of these I/O devices. I/O interface 1008 may include one or more I/O interfaces 1008, where appropriate. Although this disclosure describes and illustrates a particular I/O interface, this disclosure contemplates any suitable I/O interface.

In particular embodiments, communication interface 1010 includes hardware, software, or both providing one or more interfaces for communication (such as, for example, packet-based communication) between computer system 1000 and one or more other computer systems 1000 or one or more networks. As an example and not by way of limitation, communication interface 1010 may include a network interface controller (NIC) or network adapter for communicating with an Ethernet or any other wire-based network or a wireless NIC (WNIC) or wireless adapter for communicating with a wireless network, such as a WI-FI™ network. This disclosure contemplates any suitable network and any suitable communication interface 1010 for it. As an example and not by way of limitation, computer system 1000 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1000 may communicate with a wireless PAN (WPAN) (such as, for example, a Bluetooth™ WPAN), a WI-FI™ network, a WI-MAX network, a cellular telephone network (such as, for example, a Global System for Mobile Communications (GSM) network), or any other suitable wireless network or a combination of two or more of these. Computer system 1000 may include any suitable communication interface 1010 for any of these networks, where appropriate. Communication interface 1010 may include one or more communication interfaces 1010, where appropriate. Although this disclosure describes and illustrates a particular communication interface, this disclosure contemplates any suitable communication interface.

In particular embodiments, bus 1012 includes hardware, software, or both coupling components of computer system 1000 to each other. As an example and not by way of limitation, bus 1012 may include an Accelerated Graphics Port (AGP) or any other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1012 may include one or more buses 1012, where appropriate. Although this disclosure describes and illustrates a particular bus, this disclosure contemplates any suitable bus or interconnect.

Herein, a computer-readable non-transitory storage medium or media may include one or more semiconductor-based or other types of integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method comprising, by a computing system:
generating a simulated sensor based on performance features associated with a sensor;
determining a placement indicator specifying a location and orientation of the simulated sensor on a vehicle in a virtual environment associated with the vehicle;
simulating, based on the performance features associated with the sensor, behavior of emissions originating from the simulated sensor in the virtual environment as rays emitted from the simulated sensor into the virtual environment as representations of a field-of-view (FOV) of the simulated sensor relative to the virtual environment, wherein the simulating comprises determining a number of the emissions that interact with the virtual environment including one or more simulated objects in the virtual environment; and
providing a representation of a capability of the sensor in the location and orientation simulated on the vehicle based on the behavior of the emissions by calculating a performance metric for the simulated sensor based on the behavior of the emissions, including a beam efficiency metric that defines a ratio of the number of emission interactions to a total number of simulated emissions to quantify wasted emissions that indicate which of the emissions did not interact with the one or more simulated objects.

2. The method of claim 1, further comprising providing the representation of the capability of the sensor by:
generating a visual representation of the emissions interactions with the one or more simulated objects in the virtual environment.

3. The method of claim 1, further comprising
identifying a number of the emissions that interact with the simulated sensor and the vehicle; and
calculating the performance metric as a ratio of the number of the emissions that interact with the simulated sensor and the vehicle versus a number of the emissions that interact with the virtual environment.

4. The method of claim 1, wherein providing the representation of the capability of the sensor includes:
estimating a sensor coverage for the simulated sensor at the location and orientation based on the behavior of the emissions in the virtual environment.

5. The method of claim 4,
wherein estimating the sensor coverage includes determining when the sensor coverage does not satisfy a threshold sensor coverage; and
providing a notification indicating that the sensor coverage does not satisfy the threshold sensor coverage.

6. The method of claim 4, further comprising:
generating a visual representation of the sensor coverage of the simulated sensor.

7. The method of claim 4, further comprising providing the representation of the capability of the sensor by:
identifying one or more areas of the virtual environment beyond the sensor coverage of the simulated sensor at the placement indicator based on the behavior.

8. The method of claim 1, further comprising:
determining a sensor type of the simulated sensor, wherein:
simulating behavior of the emissions originating from the simulated sensor in the virtual environment further comprises:
projecting each emission from the simulated sensor into the virtual environment wherein properties of projecting, including at least a direction of the emission, are determined based on the sensor type; and
detecting a point of interaction between the emissions and a surface corresponding to a simulated object in the virtual environment.

9. The method of claim 8, wherein a number of emissions projected in a particular portion of the virtual environment over a particular time window is determined based on the performance features associated with the sensor.

10. The method of claim 1, further comprising providing the representation of the capability of the sensor by:
  generating a plurality of virtual environments by procedurally generating an arrangement of a plurality of objects in each virtual environment;
  simulating behavior of emissions originating from the simulated sensor in each virtual environment of the plurality of virtual environments; and
  combining a representation of the capability of the sensor determined with respect to each virtual environment.

11. The method of claim 1, further comprising generating the virtual environment by:
  constructing a virtual environment encompassing a vehicle operation scenario; and
  modeling activity of one or more objects in the virtual environment, wherein the activity simulates the behavior of the one or more objects in the vehicle operation scenario.

12. The method of claim 11, wherein the representation of the capability of the sensor includes a sensor coverage area associated with the sensor recommended for an autonomous vehicle to navigate the vehicle operation scenario.

13. The method of claim 11, wherein the representation of the capability of the sensor includes a performance of the sensor with respect to the one or more objects in the vehicle operation scenario.

14. The method of claim 1, further comprising modeling a location and orientation of the simulated sensor in the virtual environment by:
  accessing a model of the vehicle having an arrangement of discrete sensor placement locations, wherein an arrangement of discrete sensor placement locations of the model of the vehicle corresponds to the arrangement of the discrete sensor placement locations of the vehicle; and
  positioning the simulated sensor on the model of the vehicle among the arrangement of discrete sensor placement locations.

15. The method of claim 14, further comprising:
  recommending a location and orientation of the sensor on the vehicle based on an optimization of the representation of the capability of the sensor.

16. The method of claim 1, further comprising:
  modeling the simulated sensor in the virtual environment based on the location and orientation of the simulated sensor specified in the placement indicator.

17. A system comprising: one or more processors and one or more computer-readable non-transitory storage media coupled to the one or more of the processors, the one or more computer-readable non-transitory storage media comprising instructions operable when executed by one or more of the processors to cause the system to:
  generate a simulated sensor based on performance features associated with a sensor;
  determine a placement indicator specifying a location and orientation of the simulated sensor on a vehicle in a virtual environment associated with the vehicle;
  simulate, based on the performance features associated with the sensor, behavior of emissions originating from the simulated sensor in the virtual environment as rays emitted from the simulated sensor into the virtual environment as representations of a field-of-view (FOV) of the simulated sensor relative to the virtual environment, wherein the instructions to simulate include instructions to determine a number of the emissions that interact with the virtual environment including one or more simulated objects in the virtual environment; and
  provide a representation of a capability of the sensor in the location and orientation simulated on the vehicle based on the behavior of the emissions by calculating a performance metric for the simulated sensor based on the behavior of the emissions, including a beam efficiency metric that defines a ratio of the number of emission interactions to a total number of simulated emissions to quantify wasted emissions that indicate which of the emissions did not interact with the one or more simulated objects.

18. The system of claim 17, wherein the instructions are further operable when executed by one or more of the processors to cause the system to provide the representation of the capability of the sensor by:
  generating a visual representation of the emissions interactions with the one or more simulated objects in the virtual environment.

19. One or more computer-readable non-transitory storage media embodying software that is operable when executed to cause one or more processors to perform operations comprising:
  generate a simulated sensor based on performance features associated with a sensor;
  determine a placement indicator specifying a location and orientation of the simulated sensor on a vehicle in a virtual environment associated with the vehicle;
  simulate, based on the performance features associated with the sensor, behavior of emissions originating from the simulated sensor in the virtual environment as rays emitted from the simulated sensor into the virtual environment as representations of a field-of-view (FOV) of the simulated sensor relative to the virtual environment, wherein the simulating comprises determining a number of the emissions that interact with the virtual environment including one or more simulated objects in the virtual environment; and
  provide a representation of a capability of the sensor in the location and orientation simulated on the vehicle based on the behavior of the emissions by calculating a performance metric for the simulated sensor based on the behavior of the emissions, including a beam efficiency metric that defines a ratio of the number of emission interactions to a total number of simulated emissions to quantify wasted emissions that indicate which of the emissions did not interact with the one or more simulated objects.

\* \* \* \* \*